United States Patent
Shimamoto et al.

(10) Patent No.: US 10,892,714 B2
(45) Date of Patent: Jan. 12, 2021

(54) POWER AMPLIFIER CIRCUIT

(71) Applicant: Murata Manufacturing Co., Ltd., Kyoto (JP)

(72) Inventors: Kenichi Shimamoto, Kyoto (JP); Hisanori Namie, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/599,247

(22) Filed: Oct. 11, 2019

(65) Prior Publication Data

US 2020/0119695 A1 Apr. 16, 2020

(30) Foreign Application Priority Data

Oct. 12, 2018 (JP) .................. 2018-193611
Jun. 19, 2019 (JP) .................. 2019-113497

(51) Int. Cl.
*H03F 1/02* (2006.01)
*H03F 3/21* (2006.01)
*H03F 1/56* (2006.01)
*H03G 1/00* (2006.01)
*H03G 3/30* (2006.01)

(52) U.S. Cl.
CPC ............ *H03F 1/0211* (2013.01); *H03F 1/56* (2013.01); *H03F 3/21* (2013.01); *H03G 1/0017* (2013.01); *H03G 1/0082* (2013.01); *H03G 3/3036* (2013.01); *H03F 2200/102* (2013.01); *H03F 2200/222* (2013.01); *H03F 2200/318* (2013.01); *H03F 2200/387* (2013.01); *H03F 2200/451* (2013.01); *H03G 2201/307* (2013.01)

(58) Field of Classification Search
CPC .................................................... H03F 1/0211
See application file for complete search history.

(56) References Cited

U.S. PATENT DOCUMENTS 7,944,306 B2 * 5/2011 Prikhodko ............ H03F 1/0211
330/285
2006/0232341 A1 * 10/2006 Iwata ...................... H03F 3/189
330/296

(Continued)

FOREIGN PATENT DOCUMENTS

JP 2012-138677 A 7/2012
JP 2014-171170 A 9/2014

*Primary Examiner* — Patricia T Nguyen
(74) *Attorney, Agent, or Firm* — Pearne & Gordon LLP

(57) ABSTRACT

A power amplifier circuit includes a first transistor that amplifies an RF signal; a bias current source that supplies a bias current to a second terminal of the first transistor through a first current path; and an adjustment circuit that adjusts the bias current in accordance with a variable power-supply voltage supplied from a power-supply terminal. The adjustment circuit includes first to third resistors, and an adjustment transistor including a first terminal connected to the power-supply terminal through the first resistor, a second terminal connected to the bias current source through the second resistor, and a third terminal connected to the first current path through the third resistor. When the variable power-supply voltage is not less than a first voltage and not greater than a third voltage, the adjustment circuit increases a current that flows to the power-supply terminal through a second current path as the variable power-supply voltage decreases.

21 Claims, 25 Drawing Sheets

(56) References Cited

U.S. PATENT DOCUMENTS

| | | | |
|---|---|---|---|
| 2011/0032037 A1* | 2/2011 | Kang | H03F 3/19 |
| | | | 330/288 |
| 2014/0253243 A1 | 9/2014 | Hagisawa et al. | |
| 2015/0070092 A1* | 3/2015 | Ishimoto | H03F 3/211 |
| | | | 330/291 |
| 2015/0130537 A1* | 5/2015 | Nakamura | H03F 3/211 |
| | | | 330/254 |
| 2018/0375474 A1 | 12/2018 | Namie | |
| 2019/0326865 A1* | 10/2019 | Okabe | H03F 3/213 |
| 2020/0021259 A1* | 1/2020 | Kim | H03F 3/24 |

* cited by examiner

POWER AMPLIFIER CIRCUIT

This application claims priority from Japanese Patent Application No. 2018-193611, filed on Oct. 12, 2018, and claims priority from Japanese Patent Application No. 2019-113497, filed on Jun. 19, 2019. The contents of these applications are incorporated herein by reference in their entireties.

BACKGROUND OF THE DISCLOSURE

1. Field of the Disclosure

The present disclosure relates to a power amplifier circuit.

2. Description of the Related Art

In mobile communication terminals, such as cellular phones, a power amplifier circuit is used that amplifies a radio frequency (RF) signal to be transmitted to a base station. The power amplifier circuit includes a transistor that amplifies the RF signal, and a bias circuit that controls a bias point of the transistor. For example, as disclosed in Japanese Unexamined Patent Application Publication No. 2014-171170, there is a power amplifier circuit including, as this type of bias circuit, an emitter follower transistor configured to supply a bias signal to a transistor, and a constant voltage generation circuit configured to generate a constant voltage to be supplied to a collector of the emitter follower transistor.

In recent years, attention has focused on an envelope tracking (ET) scheme in which a power-supply voltage is controlled in accordance with an envelope of a transmission signal to cause a transistor to operate with high efficiency. In such an ET scheme, when a gain difference (gain dispersion) for a change in the power-supply voltage to be supplied to the transistor is provided, linearity can be maintained. Here, there is typically a trade-off between gain linearity and power efficiency, and a desirable range of gain dispersion differs according to whether to give higher priority to one or the other of these characteristics. Hence, to get performance out of the ET scheme, it is desirable that the range of gain dispersion is adjustable according to the demanded specifications. However, in the bias circuit disclosed in Japanese Unexamined Patent Application Publication No. 2014-171170, it is difficult to adjust the range of gain dispersion.

BRIEF SUMMARY OF THE DISCLOSURE

Thus, the present disclosure proposes a power amplifier circuit in which the range of gain dispersion is adjustable.

A power amplifier circuit according to the present disclosure includes a first transistor including a first terminal to which a voltage corresponding to a variable power-supply voltage greater than or equal to a first voltage and lower than or equal to a second voltage is supplied and a second terminal to which an RF signal is supplied and being configured to amplify the RF signal; a bias current source configured to supply a bias current to the second terminal of the first transistor through a first current path; and an adjustment circuit configured to adjust the bias current in accordance with the variable power-supply voltage supplied from a power-supply terminal. The adjustment circuit includes a first resistor, a second resistor, and a third resistor, at least any one of which is constituted by a variable resistor, and an adjustment transistor including a first terminal connected to the power-supply terminal through the first resistor, a second terminal connected to the bias current source through the second resistor, and a third terminal connected to the first current path through the third resistor. In a case where a voltage higher than the first voltage and lower than the second voltage is regarded as a third voltage and a path extending from the bias current source, through the second resistor, the adjustment transistor, and the first resistor, to the power-supply terminal is regarded as a second current path, when the variable power-supply voltage is greater than or equal to the first voltage and lower than or equal to the third voltage, the adjustment circuit increases a current that flows to the power-supply terminal through the second current path as the variable power-supply voltage decreases.

The present disclosure can provide the power amplifier circuit in which the range of gain dispersion is adjustable.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
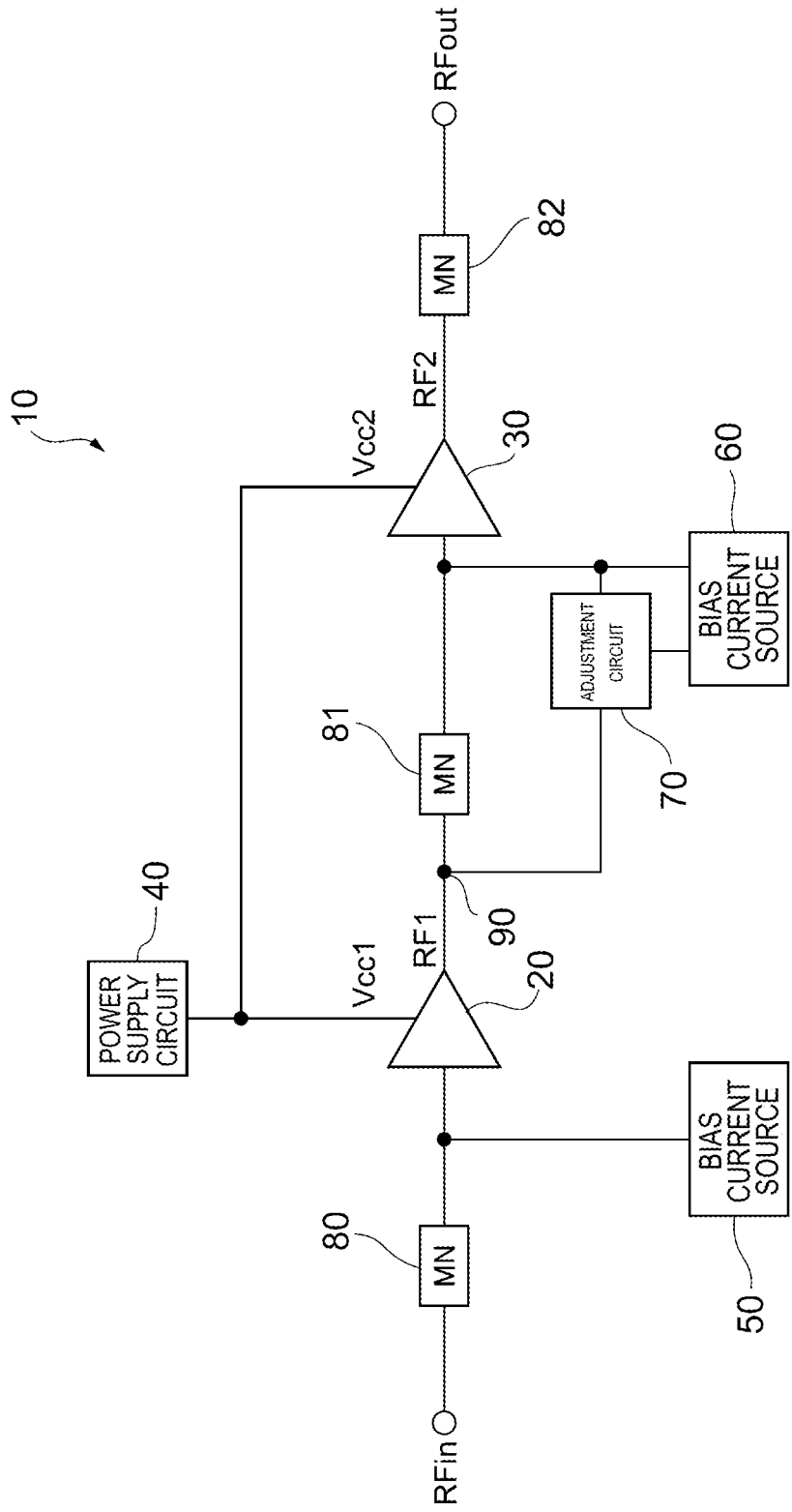
FIG. 1 illustrates an overview of a configuration of a power amplifier module including a power amplifier circuit according to an embodiment of the present disclosure.

An embodiment of the present disclosure will be described below with reference to the drawings. Here, circuit elements denoted by the same reference numerals are identical, and a repeated description thereof is omitted.

FIG. 1 illustrates an overview of a configuration of a power amplifier module including a power amplifier circuit according to an embodiment of the present disclosure. A power amplifier module 10 is installed, for example, in a mobile communication device, such as a cellular phone. The power amplifier module 10 amplifies the power of an input signal RFin to a level necessary to transmit the input signal RFin to a base station and outputs this input signal RFin as an amplified signal RFout. The input signal RFin is a radio frequency (RF) signal modulated, for example, by a radio frequency integrated circuit (RFIC) or the like in accordance with a certain communication scheme. Examples of a communication standard of the input signal RFin include the second generation mobile communication system (2G), the third generation mobile communication system (3G), the fourth generation mobile communication system (4G), the fifth generation mobile communication system (5G), long term evolution (LTE)-frequency division duplex (FDD), LTE-time division duplex (TDD), LTE-Advanced, and LTE-Advanced Pro. The frequency of the input signal RFin ranges, for example, from about several hundred MHz to about several tens of GHz. The communication standard and frequency of the input signal RFin are not limited to these.

The power amplifier module 10 includes, for example, amplifiers 20 and 30, a power supply circuit 40, bias current sources 50 and 60, an adjustment circuit 70, and matching networks 80 to 82.

Each of the amplifiers 20 and 30 amplifies an input RF signal and outputs the amplified RF signal. The first-stage (driver-stage) amplifier 20 amplifies an input signal RFin inputted from an input terminal through the matching network 80 and outputs an RF signal RF1. The subsequent-stage (power-stage) amplifier 30 amplifies the RF signal RF1 supplied from the amplifier 20 through the matching network 81 and outputs an RF signal RF2. The RF signal RF2 is outputted as an amplified signal RFout through the matching network 82. Each of the amplifiers 20 and 30 is constituted, for example, by a transistor, such as a heterojunction bipolar transistor (HBT). Incidentally, each of the amplifiers 20 and 30 may be constituted by a field-effect transistor, such as a metal-oxide-semiconductor field-effect transistor (MOSFET), in place of the HBT. In this case, a collector, a base, and an emitter are to be read as a drain, a gate, and a source, respectively. Hereinafter, as an example, the case where a transistor is constituted by an HBT will be described unless otherwise specified.

The power supply circuit 40 generates variable power-supply voltages Vcc1 and Vcc2 controlled in accordance with an envelope of an RF signal and supplies the variable power-supply voltages Vcc1 and Vcc2 to the respective amplifiers 20 and 30. Thus, the power amplifier module 10 operates in accordance with a so-called envelope tracking (ET) scheme. When the power amplifier module 10 operates in accordance with the ET scheme, power efficiency is increased in comparison with, for example, the case where the power amplifier module 10 operates in accordance with an average power tracking (APT) scheme. Incidentally, the power supply circuit 40 may be included or does not have to be included in the power amplifier module 10.

The bias current sources 50 and 60 supply a bias current or bias voltage to the respective amplifiers 20 and 30.

The adjustment circuit 70 adjusts, in accordance with the variable power-supply voltage Vcc1 supplied from a power-supply terminal 90, the amount of bias current to be supplied to the amplifier 30. Configurations of the amplifier 30, the bias current source 60, and the adjustment circuit 70 will be described in detail later.

The matching network (MN) 80 matches the impedance of a circuit (not illustrated) provided at a previous stage to that of the amplifier 20. The matching network 81 matches the impedance of the amplifier 20 to that of the amplifier 30. The matching network 82 matches the impedance of the amplifier 30 to that of a circuit (not illustrated) provided at a subsequent stage. Each of the matching networks 80 to 82 includes, for example, an inductor and a capacitor.

Figure 2A:
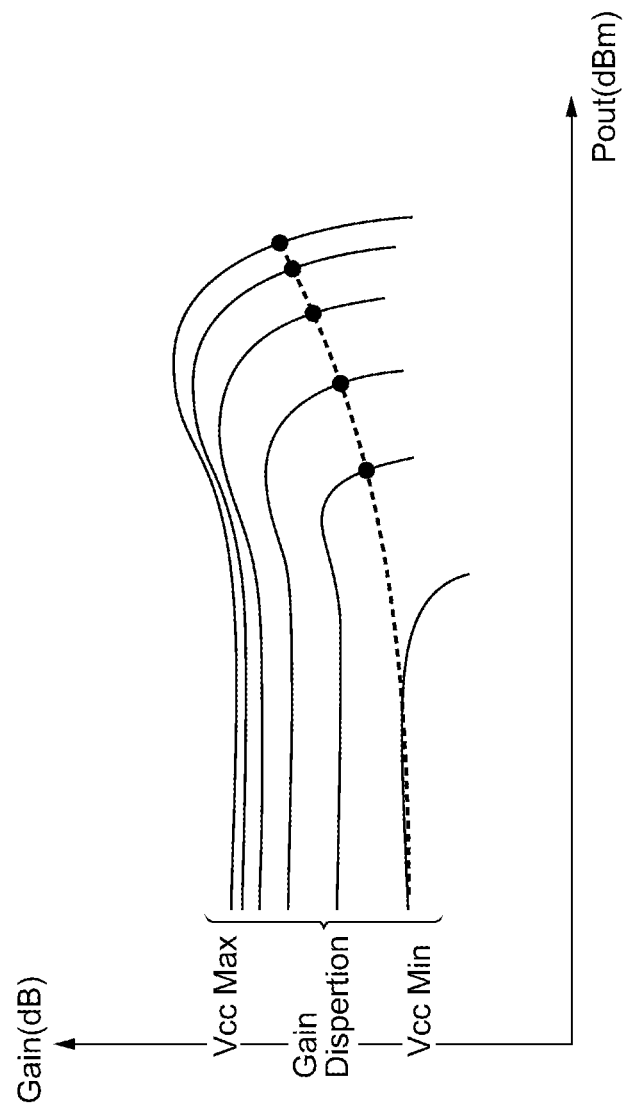
FIG. 2A illustrates graphs representing an example of a relationship between output power and gain in an ET scheme.
Figure 2B:
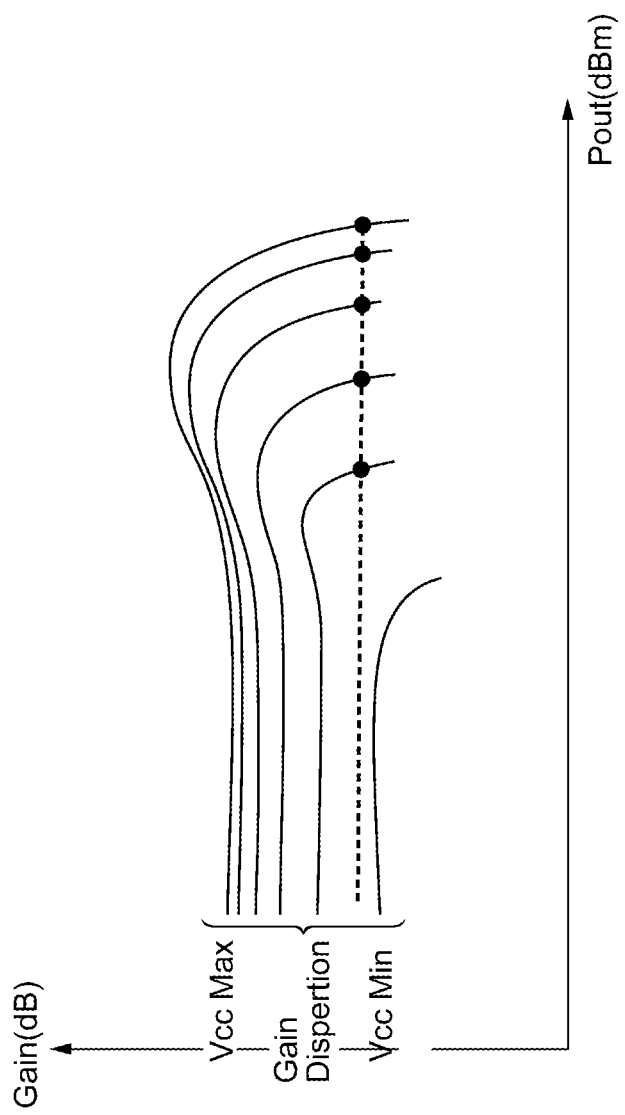
FIG. 2B illustrates graphs representing an example of a relationship between output power and gain in the ET scheme.

FIGS. 2A and 2B illustrate graphs representing an example of a relationship between output power and gain in the ET scheme. In FIGS. 2A and 2B, the vertical axis represents a gain characteristic (dB), and the horizontal axis represents output power Pout (dBm).

FIG. 2A illustrates a gain characteristic in a mode (hereinafter also referred to as "high-efficiency mode") in which higher priority is given to an increase in power efficiency than to an increase in linearity. As illustrated in FIG. 2A, when an amplifier is caused to operate so that points are connected at which efficiency is increased (ideally maximized) at respective power-supply voltages, power efficiency can be kept high, but linearity is slightly poor (see a dashed line in FIG. 2A). For example, in the case where there is provided, at a stage previous to the power amplifier module 10, a function of so-called "pre-distortion" where distortion is generated in advance so as to cancel out distortion that occurs from the amplifier, output signal distortion is compensated for, and thus the high-efficiency mode desirably functions. As an example of pre-distortion, there is digital pre-distortion (DPD). In this high-efficiency mode, it is desirable that the range of so-called "gain dispersion", which is a gain difference for a change in power-supply voltage, is relatively wide in order that a gain curve may come close to being as flat as possible.

On the other hand, FIG. 2B illustrates a gain characteristic in a mode (hereinafter also referred to as "high-linearity mode") in which higher priority is given to an increase in linearity than to an increase in power efficiency. As illustrated in FIG. 2B, when an amplifier is caused to operate so that a gain curve becomes as flat as possible, high linearity can be obtained (see a dashed line in FIG. 2B), but power efficiency is slightly poorer than that in the high-efficiency mode. For example, in the case where no DPD function is provided, the high-linearity mode desirably functions. In the high-linearity mode, it is desirable that the range of gain dispersion is relatively narrow in order that the gain obtained when a power-supply voltage is a minimum may coincide with the gain obtained when output power Pout is a maximum.

Thus, in the ET scheme, it is desirable that the range of gain dispersion can be adjusted in accordance with a demanded operation mode. The power amplifier circuit according to the present embodiment allows the range of gain dispersion to be adjusted in this way. Next, this will be described with reference to FIG. 3.

Figure 3:
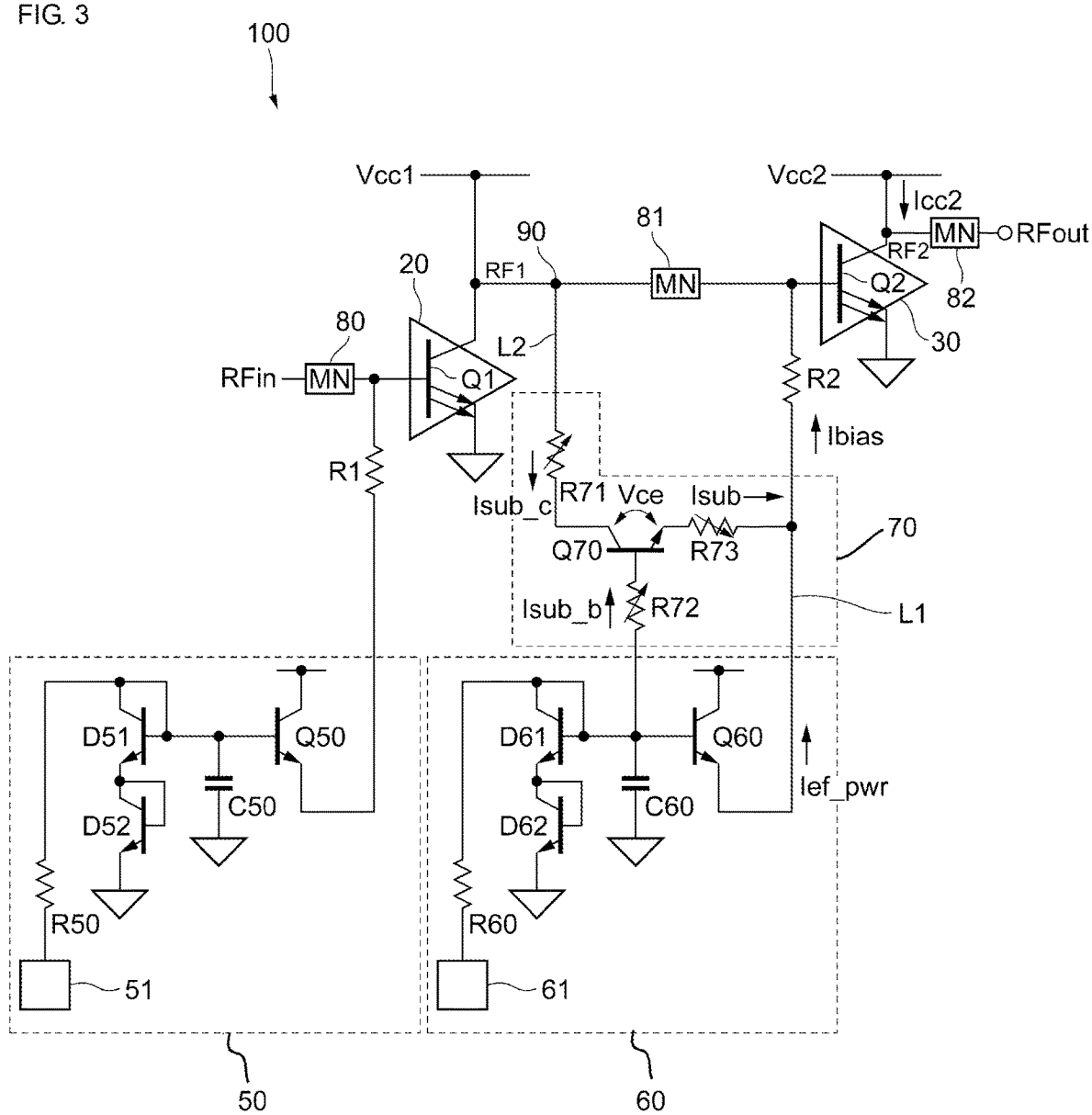
FIG. 3 illustrates an example of a configuration of a power amplifier circuit according to the embodiment of the present disclosure.

FIG. 3 illustrates an example of a configuration of a power amplifier circuit according to the embodiment of the present disclosure. A configuration of a power amplifier circuit 100 illustrated in FIG. 3 is a configuration in which the power supply circuit 40 is removed from the power amplifier module 10 illustrated in FIG. 1. In particular, the details of the elements related to the amplifiers 20 and 30, the bias current sources 50 and 60, and the adjustment circuit 70 are illustrated.

The amplifiers 20 and 30 are constituted by respective transistors Q1 and Q2. In the transistor Q1 (second transistor), the variable power-supply voltage Vcc1 is supplied to a collector (first terminal), the input signal RFin is supplied to a base (second terminal) through the matching network 80, and an emitter is grounded. Then, the RF signal RF1 obtained by amplifying the input signal RFin is outputted from the collector of the transistor Q1. In the transistor Q2 (first transistor), the variable power-supply voltage Vcc2 (that is, a voltage corresponding to the variable power-supply voltage Vcc1) is supplied to a collector (first terminal), the RF signal RF1 is supplied to a base (second terminal) through the matching network 81, and an emitter is grounded. Then, the RF signal RF2 obtained by amplifying the RF signal RF1 is outputted from the collector of the transistor Q2.

The bias current source 50 supplies a bias current or bias voltage that controls a bias point of the transistor Q1 to the base of the transistor Q1 through a resistance element R1. Specifically, the bias current source 50 includes diodes D51 and D52, a transistor Q50, a resistance element R50, a capacitor C50, and a power-supply terminal 51.

The diode D51 and the diode D52 are connected in series. A constant voltage or current is supplied from the power-supply terminal 51 to an anode of the diode D51 through the resistance element R50. An anode of the diode D52 is connected to a cathode of the diode D51, and a cathode of the diode D52 is grounded. Thus, a predetermined voltage (for example, about 2.8 V) is generated at the anode of the diode D51. Incidentally, each of the diodes D51 and D52 may be constituted, for example, by a diode-connected bipolar transistor. The term "diode-connected" refers to a connection between the base and collector of a bipolar transistor, and a diode-connected bipolar transistor acts as a bipolar element equivalent to a diode. Of two terminals of the diode-connected bipolar transistor, one terminal having a higher potential when a forward bias is applied is referred to as "anode", and the other terminal having a lower potential is referred to as "cathode". However, each of the diodes D51 and D52 may be constituted by a positive-negative (PN) junction diode in place of the diode-connected bipolar transistor.

In the transistor Q50, a battery voltage is supplied to a collector, and a base is connected to the anode of the diode D51 and also is grounded through the capacitor C50. Furthermore, an emitter of the transistor Q50 is connected to the base of the transistor Q1 through the resistance element R1. Thus, a predetermined bias current is supplied to the base of the transistor Q1.

The bias current source 60 supplies a bias current or bias voltage that controls a bias point of the transistor Q2 to the base of the transistor Q2 through a resistance element R2. Specifically, the bias current source 60 includes diodes D61 and D62, a transistor Q60, a resistance element R60, a capacitor C60, and a power-supply terminal 61. Configurations of these are similar to those in the bias current source 50, and a detailed description thereof is thus omitted.

The adjustment circuit 70 adjusts, in accordance with the variable power-supply voltage Vcc1, a bias current to be supplied to the base of the transistor Q2. Specifically, the adjustment circuit 70 includes a transistor Q70, and variable resistors R71 to R73.

A collector (first terminal) of the transistor Q70 (adjustment transistor) is connected to the power-supply terminal 90 through the variable resistor R71 (first resistor). A base (second terminal) of the transistor Q70 is connected to a base of the transistor Q60 through the variable resistor R72 (second resistor). An emitter (third terminal) of the transistor Q70 is connected to the base of the transistor Q2 through the variable resistor R73 (third resistor) and the resistance element R2. Furthermore, the emitter of the transistor Q70 is connected to an emitter of the transistor Q60 through the variable resistor R73. In the present embodiment, the transistor Q70 is, for example, a heterojunction bipolar transistor in which the emitter and the base form a heterojunction. A band gap of the emitter is larger than a band gap of the base.

Here, currents that flow through the respective variable resistors R71, R72, and R73 are denoted by Isub_c, Isub_b, and Isub. Furthermore, a current outputted from the emitter of the transistor Q60 is denoted by Ief_pwr, a bias current to be supplied to the base of the transistor Q2 is denoted by Ibias, and a current that flows to the collector of the transistor Q2 is denoted by Icc2. Furthermore, a collector-emitter voltage of the transistor Q70 is denoted by Vce. The bias current Ibias is given by Ibias=Ief_pwr+Isub, and thus the current Ief_pwr and the current Isub partially contribute to adjustment of the bias point of the transistor Q2. Thus, in the present description, each of the current Ief_pwr and the current Isub is referred to as "bias current" in some cases. Incidentally, the current Isub is given by Isub=Isub_b+Isub_c.

Figure 4:
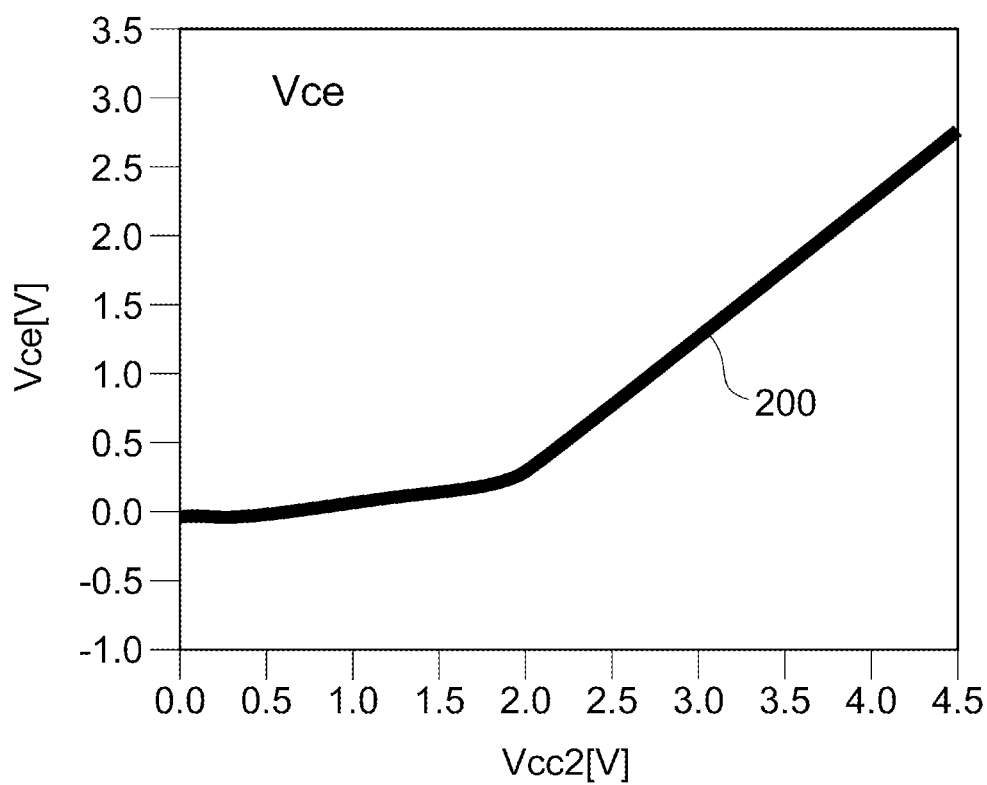
FIG. 4 is a graph representing a relationship between a variable power-supply voltage Vcc2 to be supplied to a transistor and a collector-emitter voltage Vce of a transistor that adjusts a bias current to be supplied to the transistor.
Figure 5:
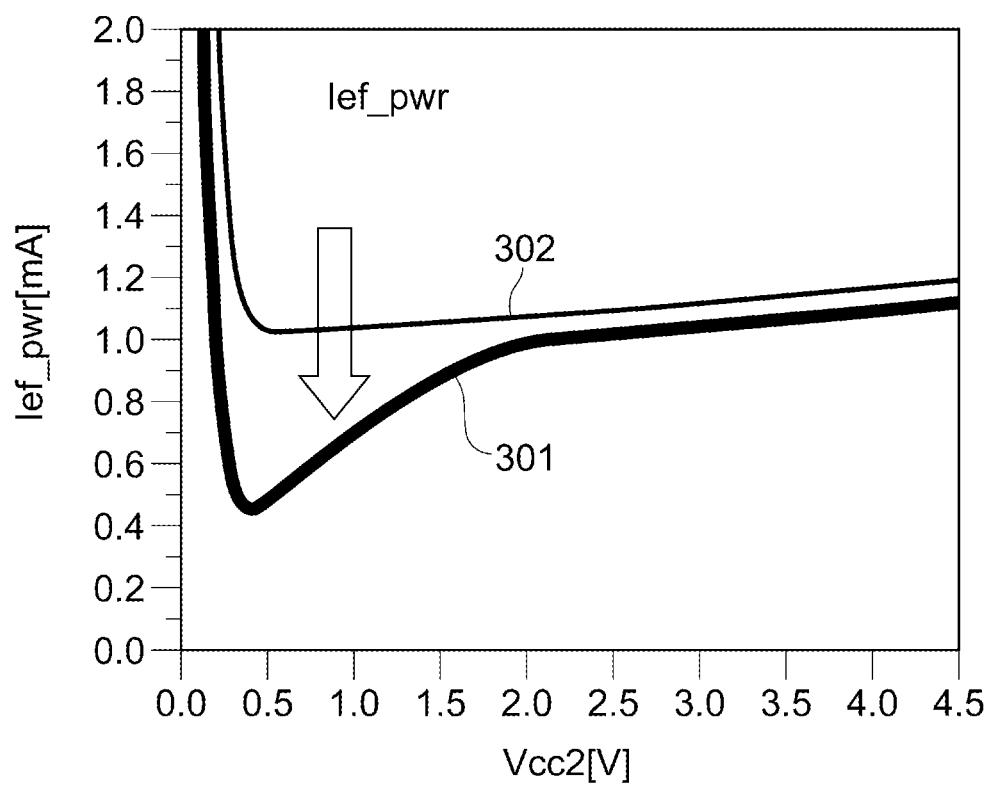
FIG. 5 illustrates graphs representing a relationship between the variable power-supply voltage Vcc2 to be supplied to the transistor and a bias current to be supplied to the transistor.
Figure 6:
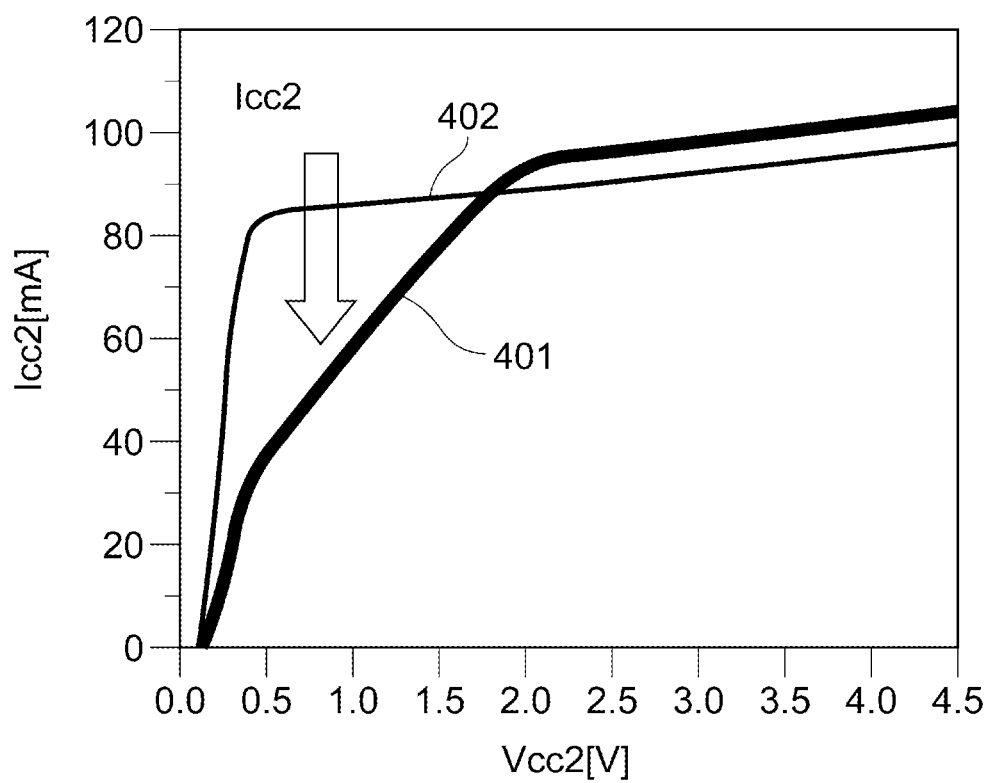
FIG. 6 illustrates graphs representing a relationship between the variable power-supply voltage Vcc2 to be supplied to the transistor and a current that flows to a collector of the transistor.
Figure 7:
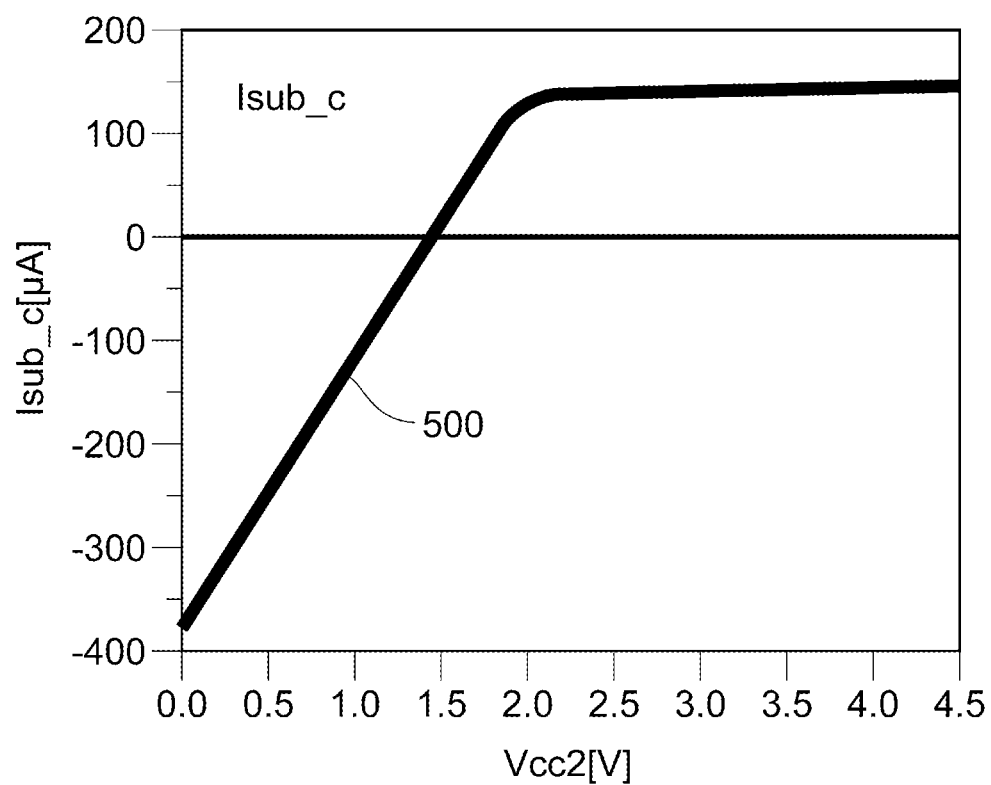
FIG. 7 is a graph representing a relationship between the variable power-supply voltage Vcc2 to be supplied to the transistor and a current that flows through an adjustment circuit that adjusts a bias current to be supplied to the transistor.
Figure 8:
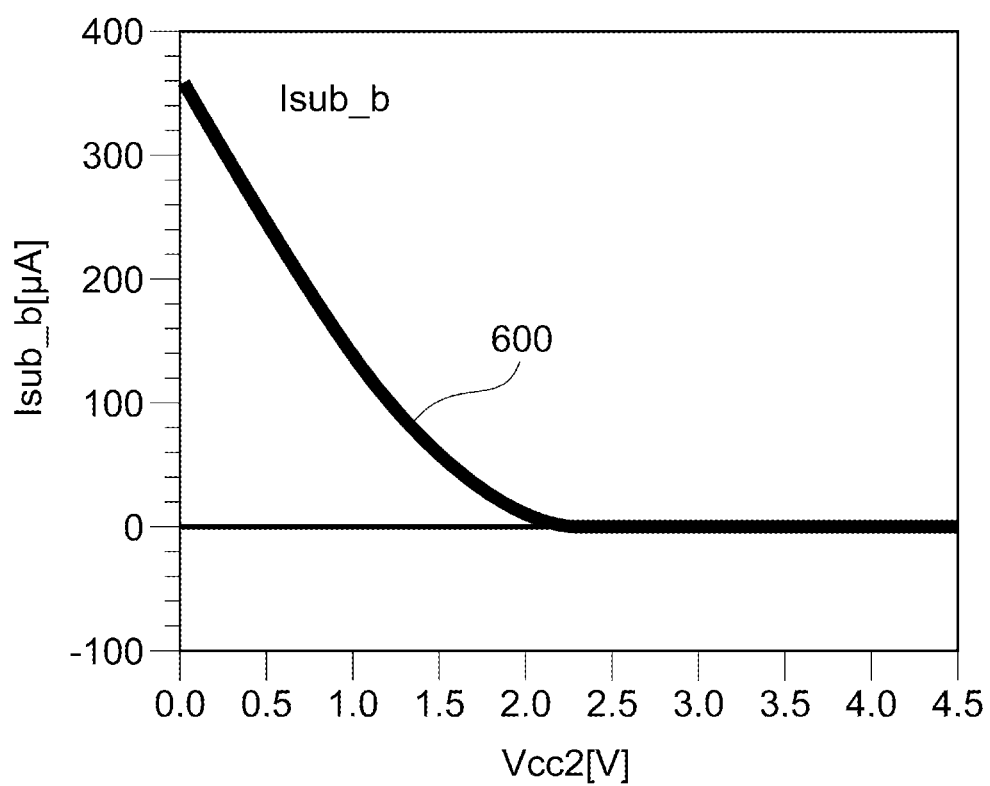
FIG. 8 is a graph representing a relationship between the variable power-supply voltage Vcc2 to be supplied to the transistor and a current that flows through the adjustment circuit that adjusts the bias current to be supplied to the transistor.
Figure 9:
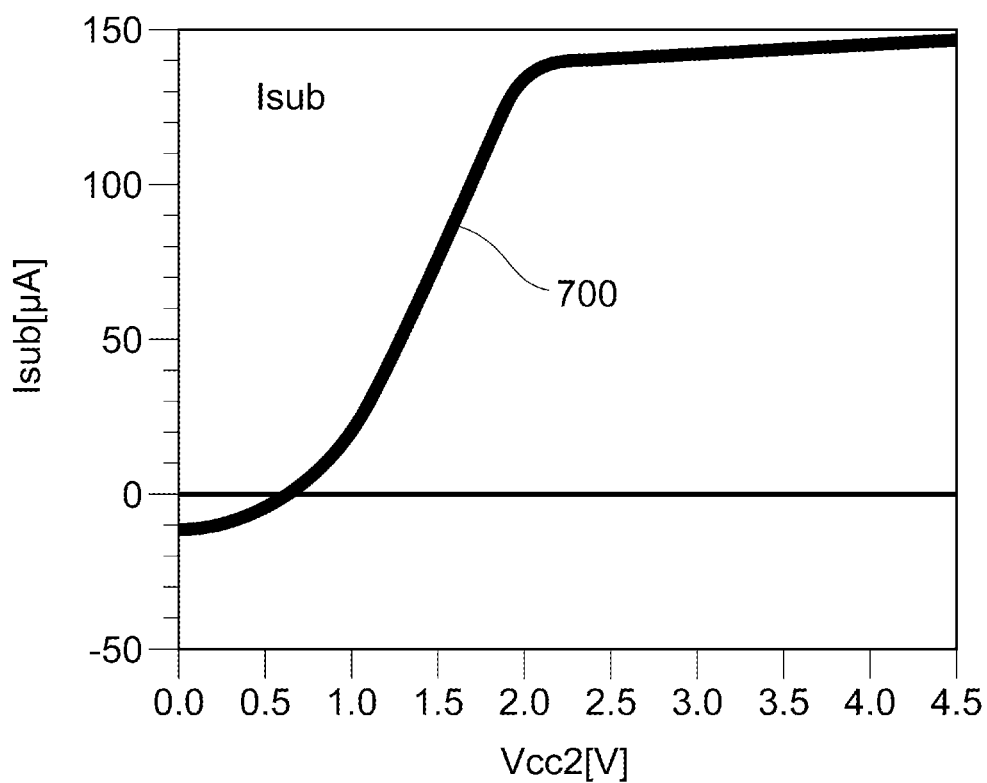
FIG. 9 is a graph representing a relationship between the variable power-supply voltage Vcc2 to be supplied to the transistor and a current that flows through the adjustment circuit that adjusts the bias current to be supplied to the transistor.
Figure 10A:
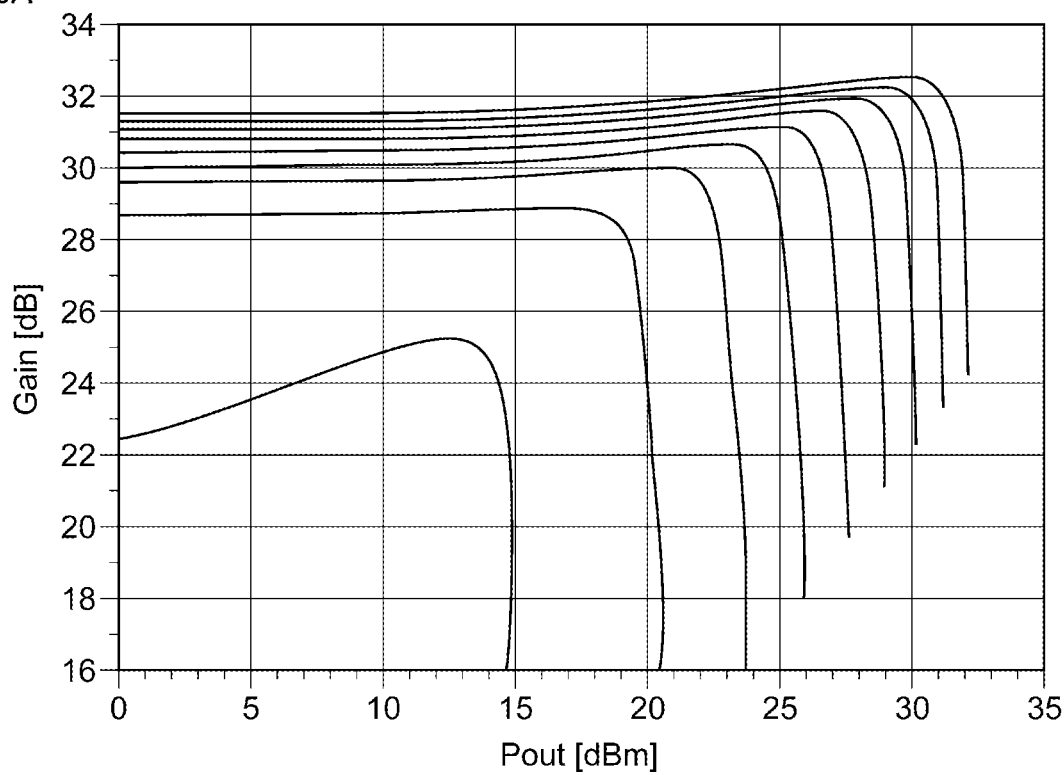
FIG. 10A illustrates graphs representing simulation results of a gain characteristic in the case where, in the power amplifier circuit, a resistance value of a variable resistor is varied.
Figure 10B:
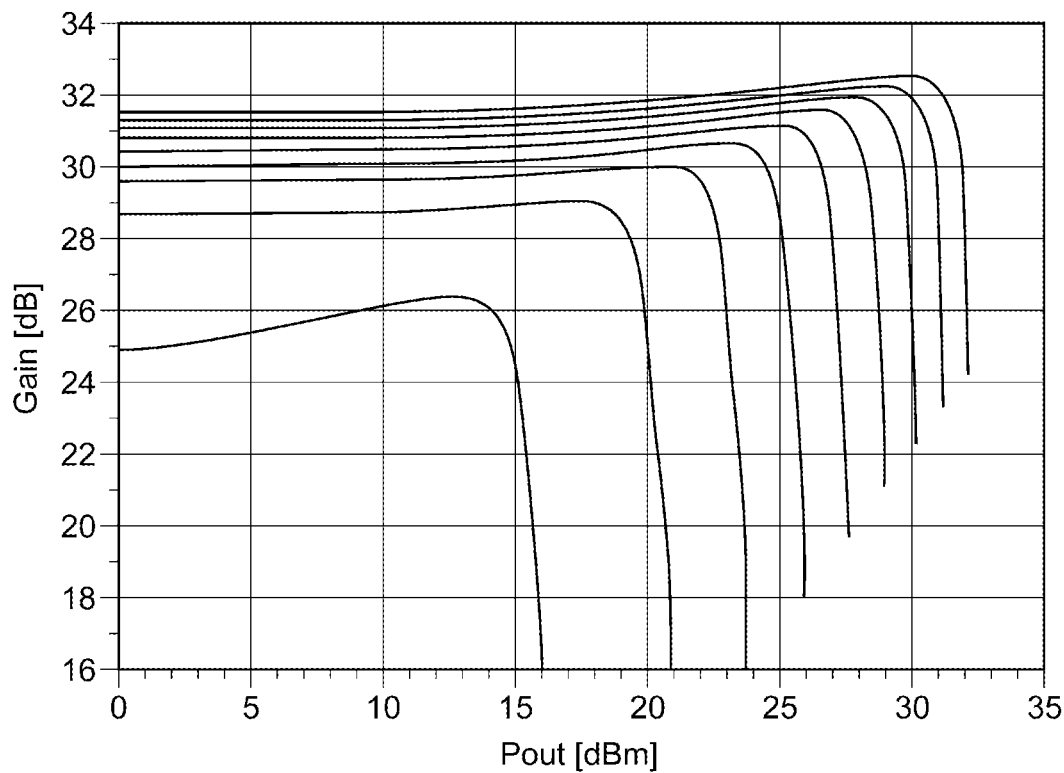
FIG. 10B illustrates graphs representing simulation results of a gain characteristic in the case where, in the power amplifier circuit, the resistance value of the variable resistor is varied.
Figure 10C:
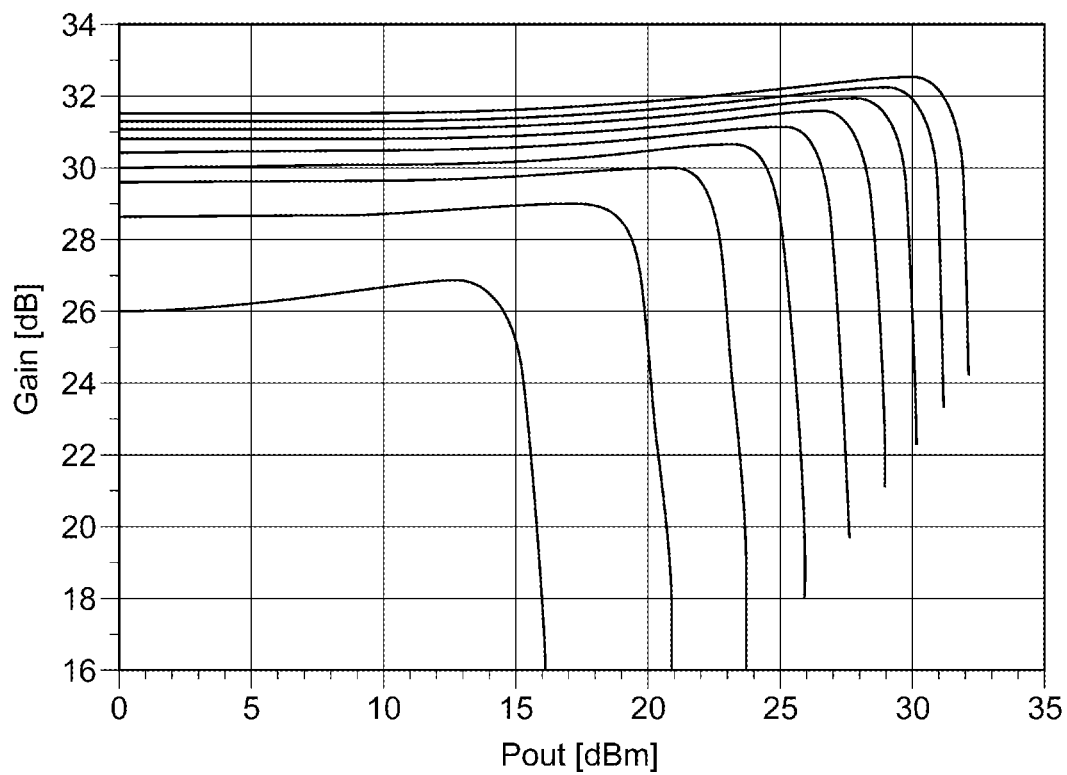
FIG. 10C illustrates graphs representing simulation results of a gain characteristic in the case where, in the power amplifier circuit, the resistance value of the variable resistor is varied.
Figure 10D:
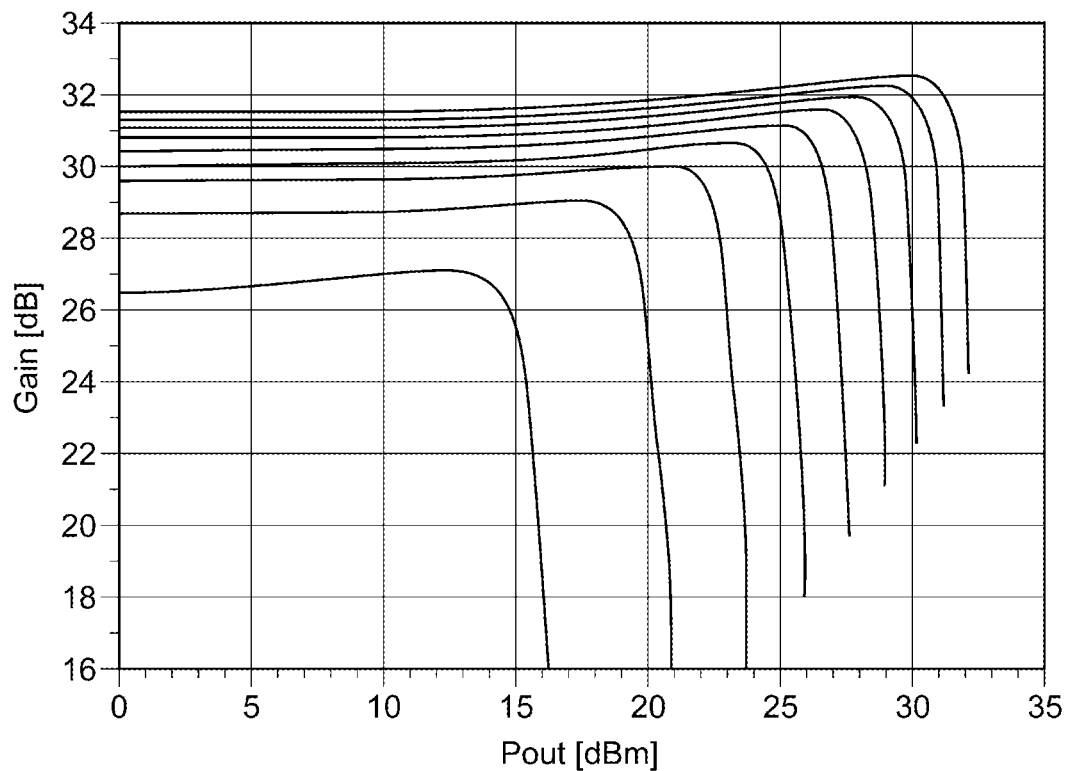
FIG. 10D illustrates graphs representing simulation results of a gain characteristic in the case where, in the power amplifier circuit, the resistance value of the variable resistor is varied.
Figure 10E:
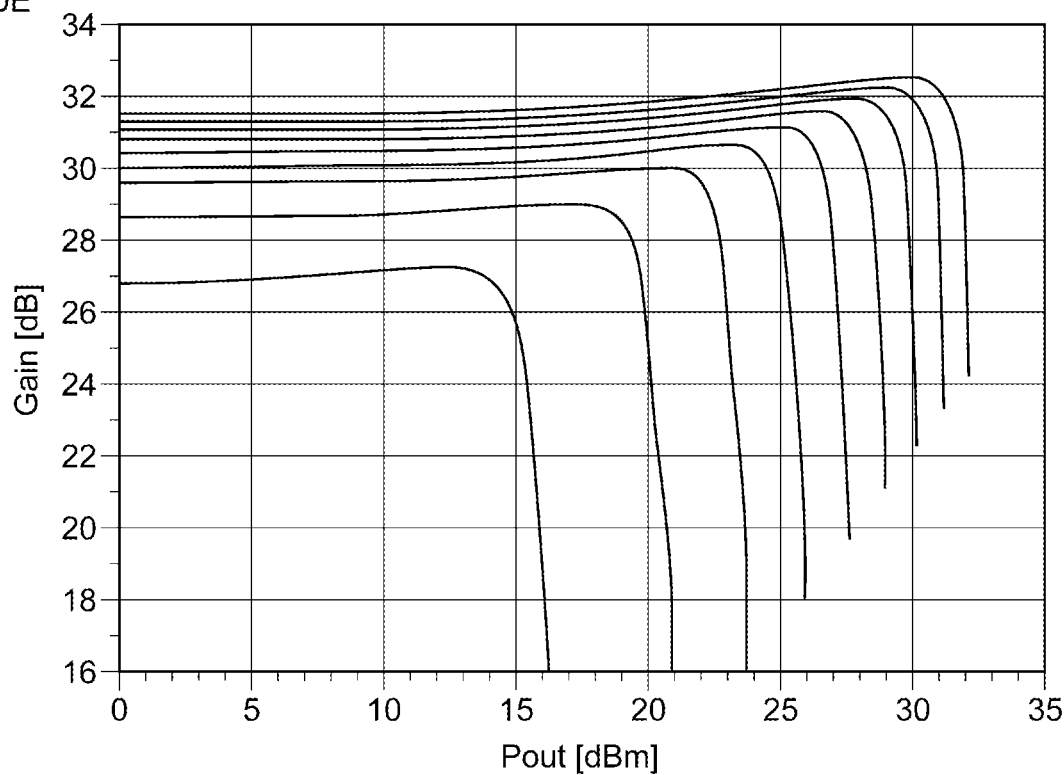
FIG. 10E illustrates graphs representing simulation results of a gain characteristic in the case where, in the power amplifier circuit, the resistance value of the variable resistor is varied.
Figure 10F:
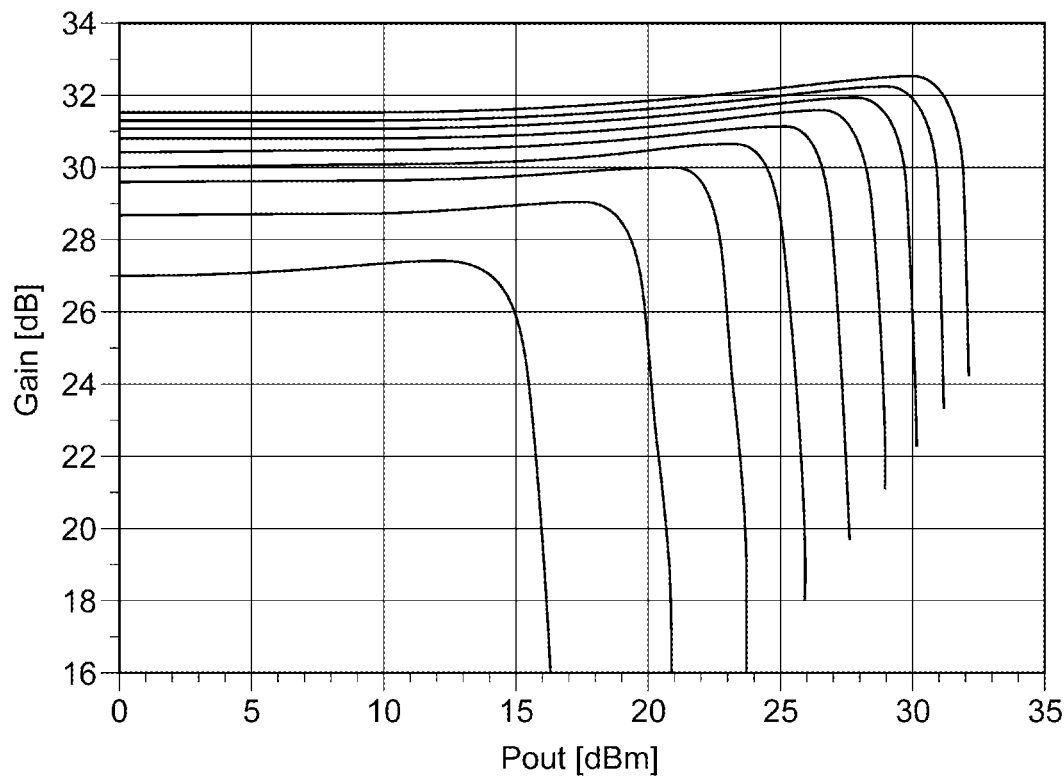
FIG. 10F illustrates graphs representing simulation results of a gain characteristic in the case where, in the power amplifier circuit, the resistance value of the variable resistor is varied.
Figure 11A:
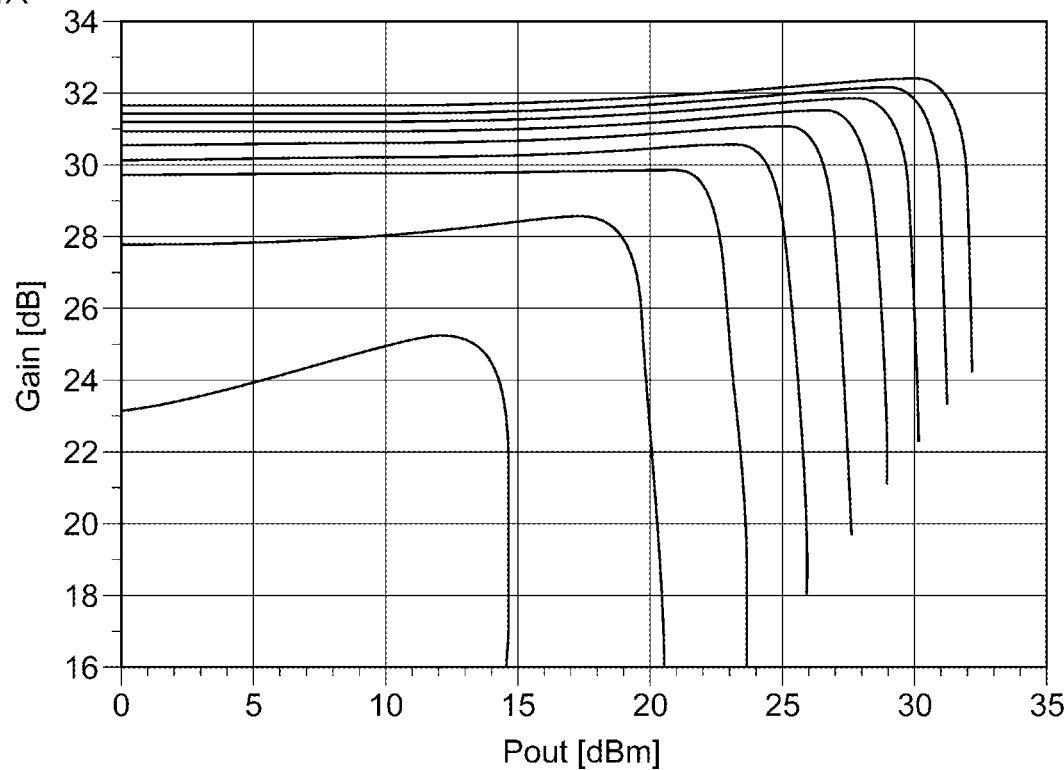
FIG. 11A illustrates graphs representing simulation results of a gain characteristic in the case where, in the power amplifier circuit, a resistance value of a variable resistor is varied.
Figure 11B:
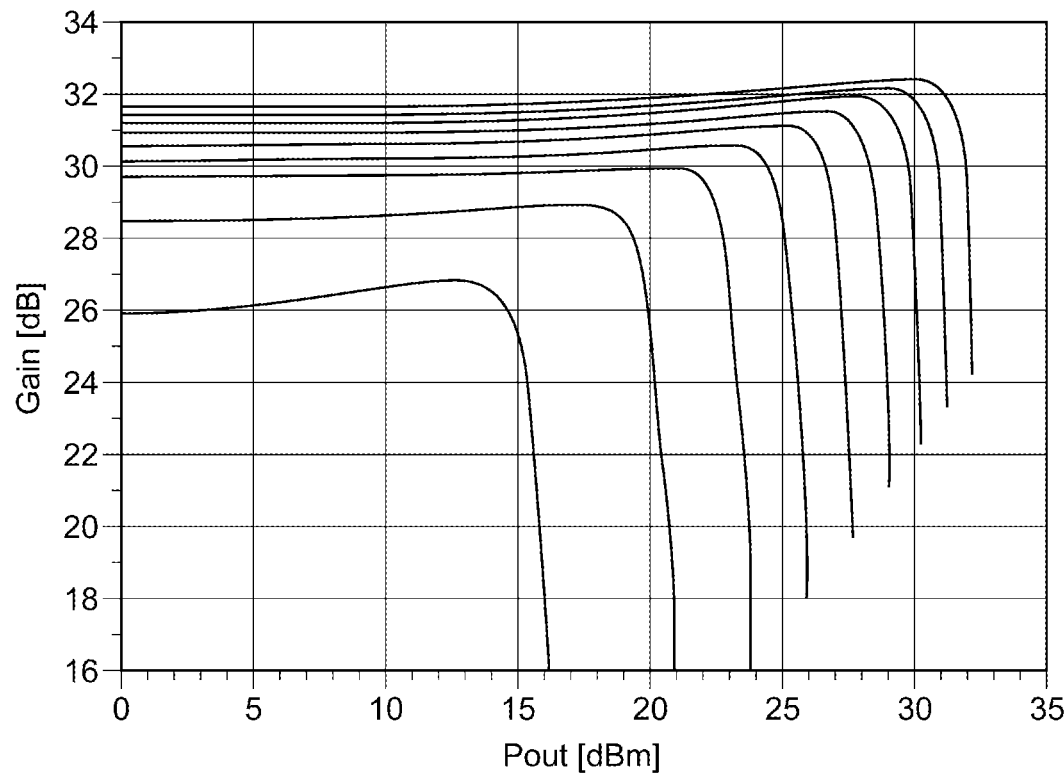
FIG. 11B illustrates graphs representing simulation results of a gain characteristic in the case where, in the power amplifier circuit, the resistance value of the variable resistor is varied.
Figure 11C:
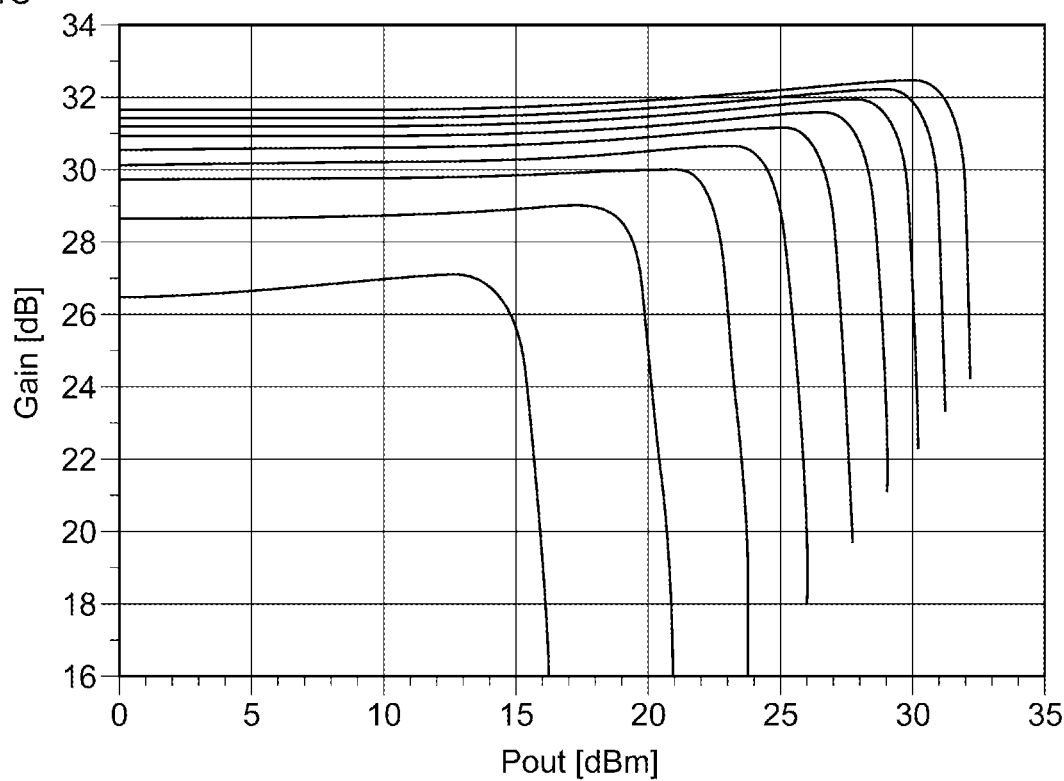
FIG. 11C illustrates graphs representing simulation results of a gain characteristic in the case where, in the power amplifier circuit, the resistance value of the variable resistor is varied.
Figure 11D:
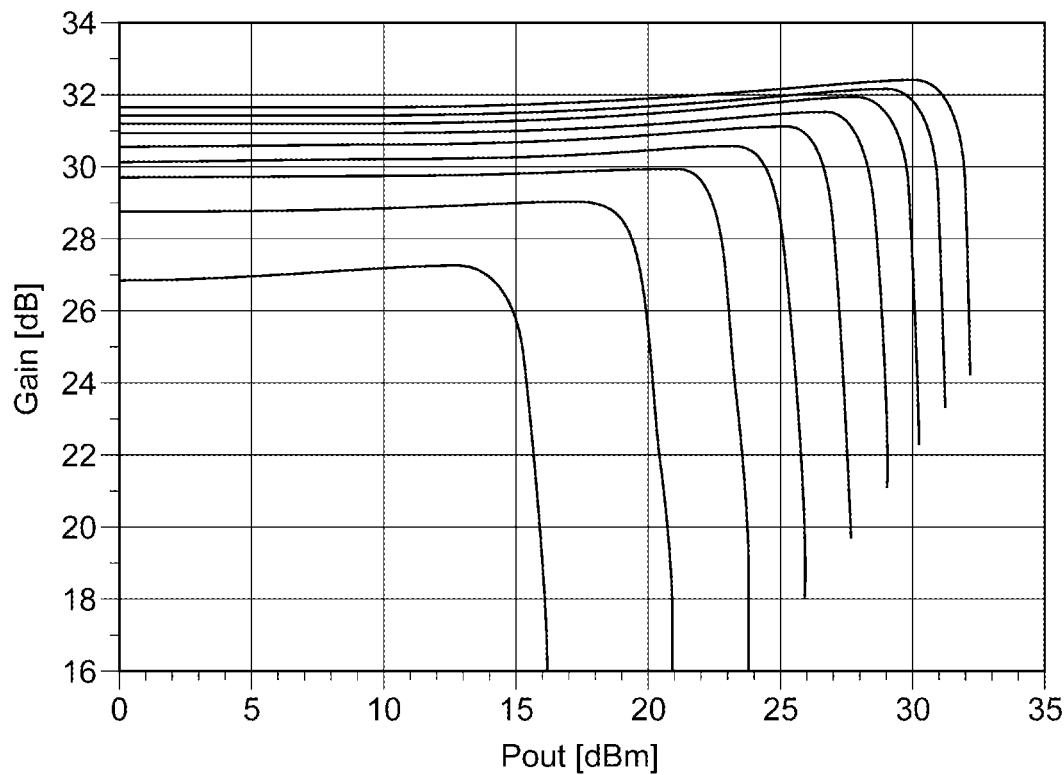
FIG. 11D illustrates graphs representing simulation results of a gain characteristic in the case where, in the power amplifier circuit, the resistance value of the variable resistor is varied.
Figure 11E:
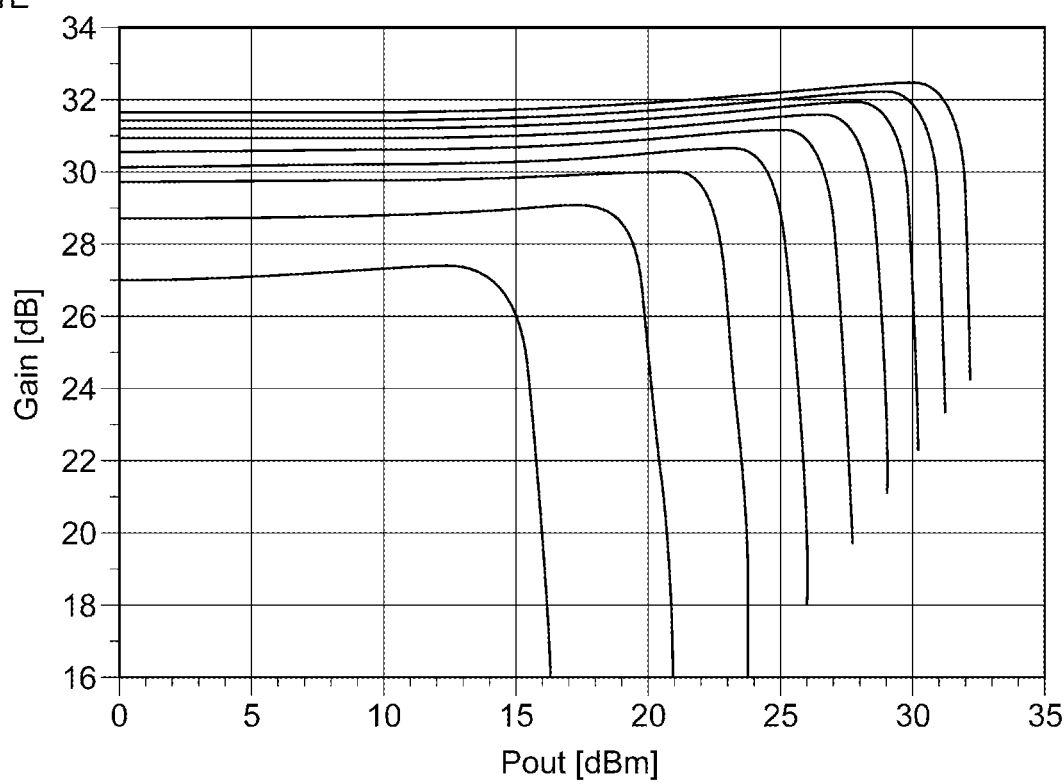
FIG. 11E illustrates graphs representing simulation results of a gain characteristic in the case where, in the power amplifier circuit, the resistance value of the variable resistor is varied.
Figure 11F:
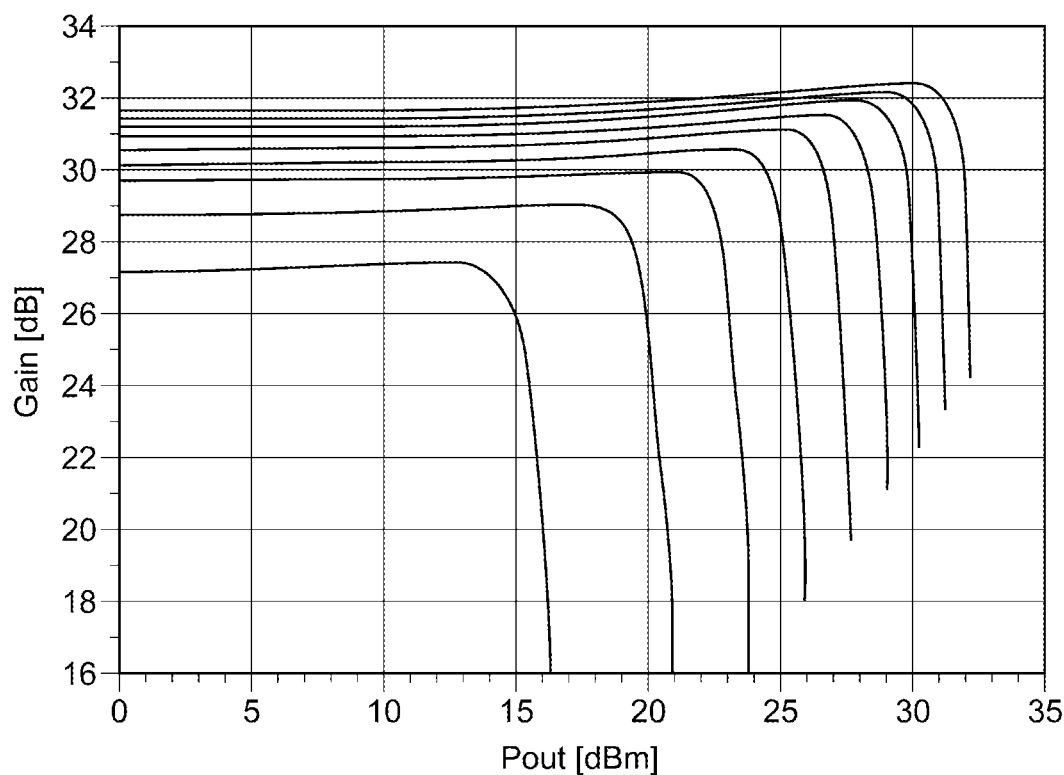
FIG. 11F illustrates graphs representing simulation results of a gain characteristic in the case where, in the power amplifier circuit, the resistance value of the variable resistor is varied.
Figure 12A:
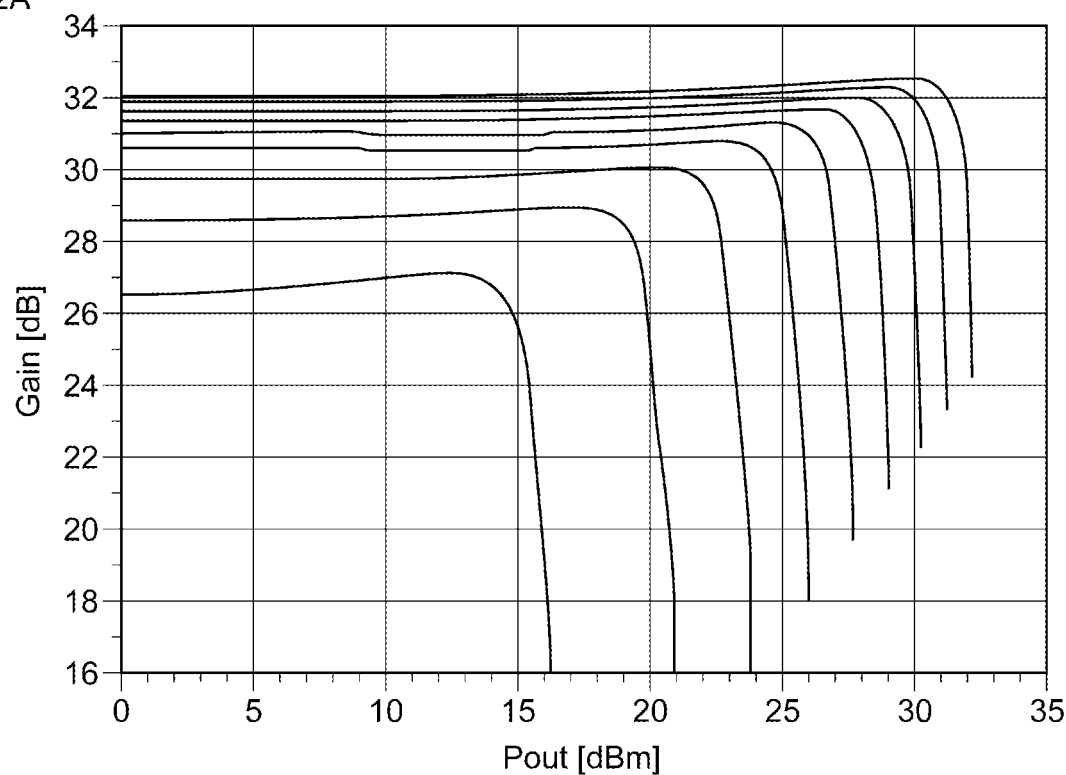
FIG. 12A illustrates graphs representing simulation results of a gain characteristic in the case where, in the power amplifier circuit, a resistance value of a variable resistor is varied.
Figure 12B:
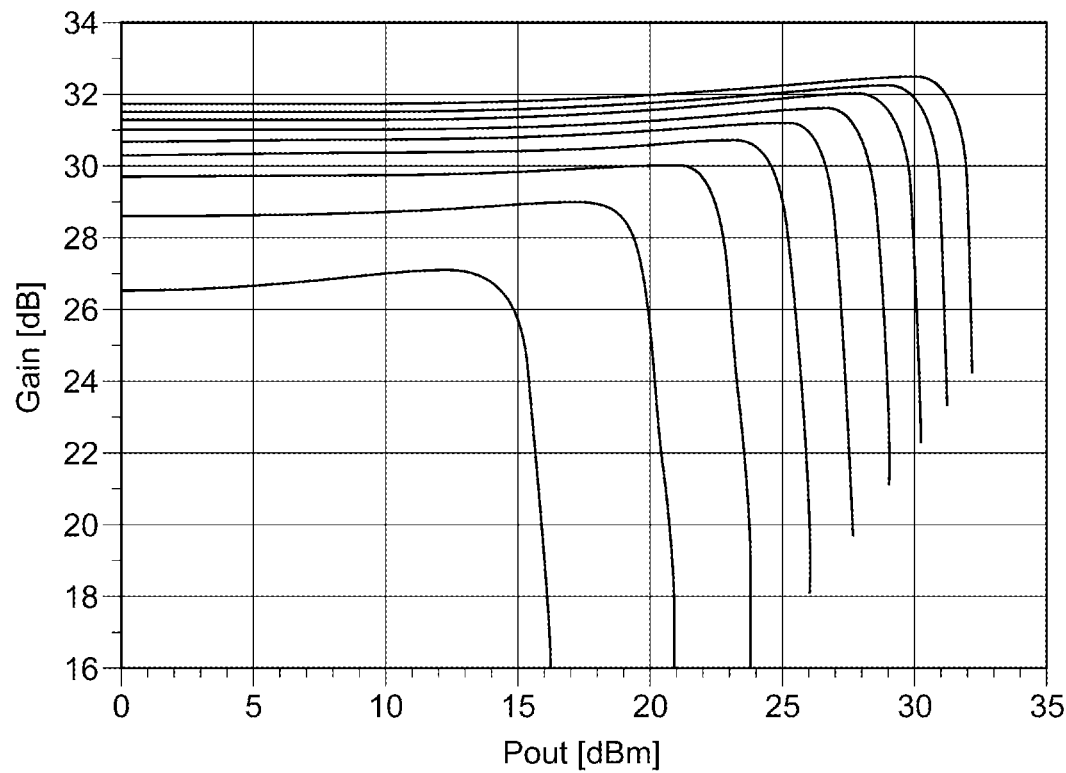
FIG. 12B illustrates graphs representing simulation results of a gain characteristic in the case where, in the power amplifier circuit, the resistance value of the variable resistor is varied.
Figure 12C:
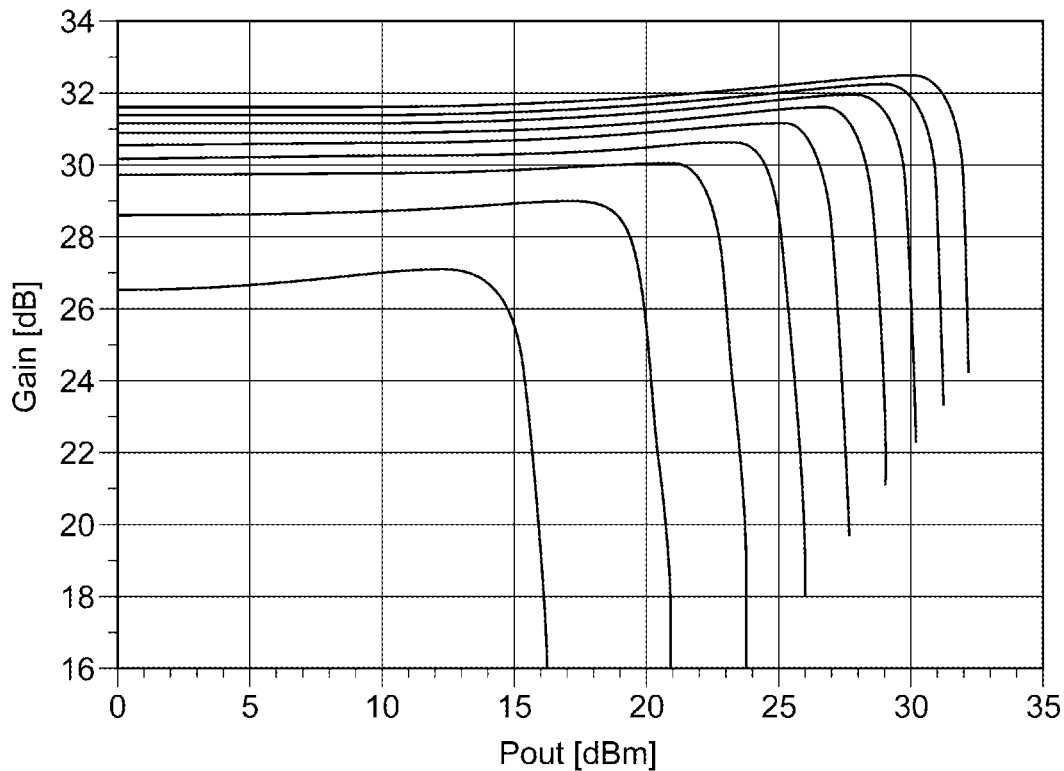
FIG. 12C illustrates graphs representing simulation results of a gain characteristic in the case where, in the power amplifier circuit, the resistance value of the variable resistor is varied.
Figure 12D:
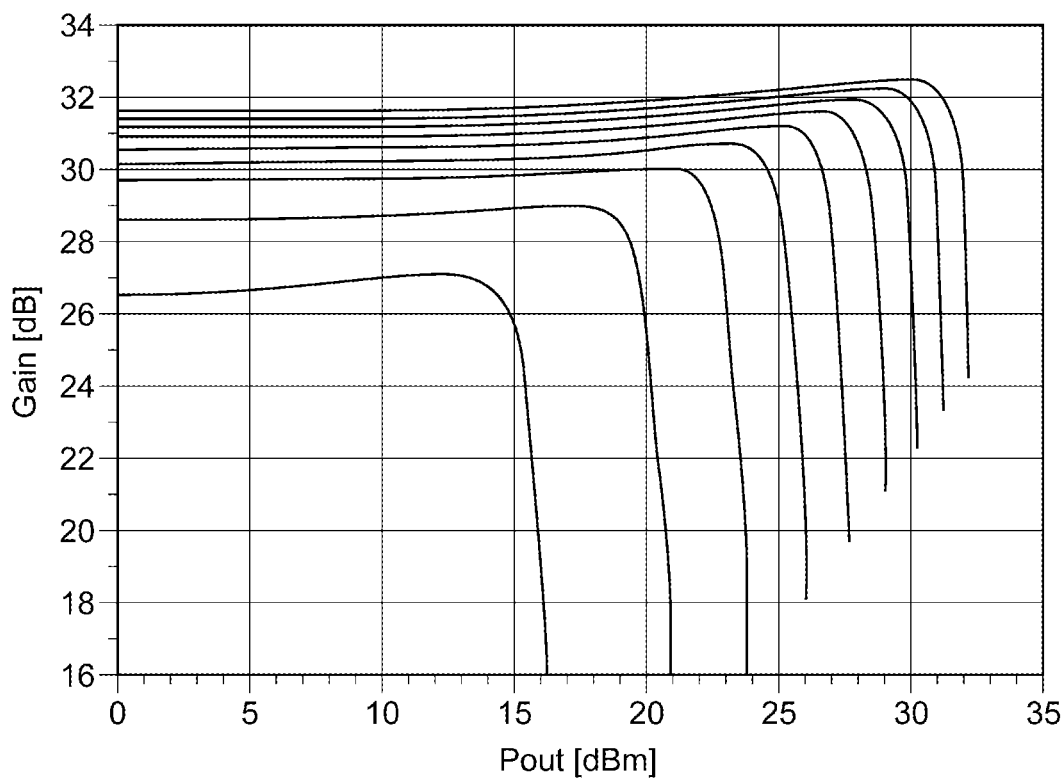
FIG. 12D illustrates graphs representing simulation results of a gain characteristic in the case where, in the power amplifier circuit, the resistance value of the variable resistor is varied.
Figure 12E:
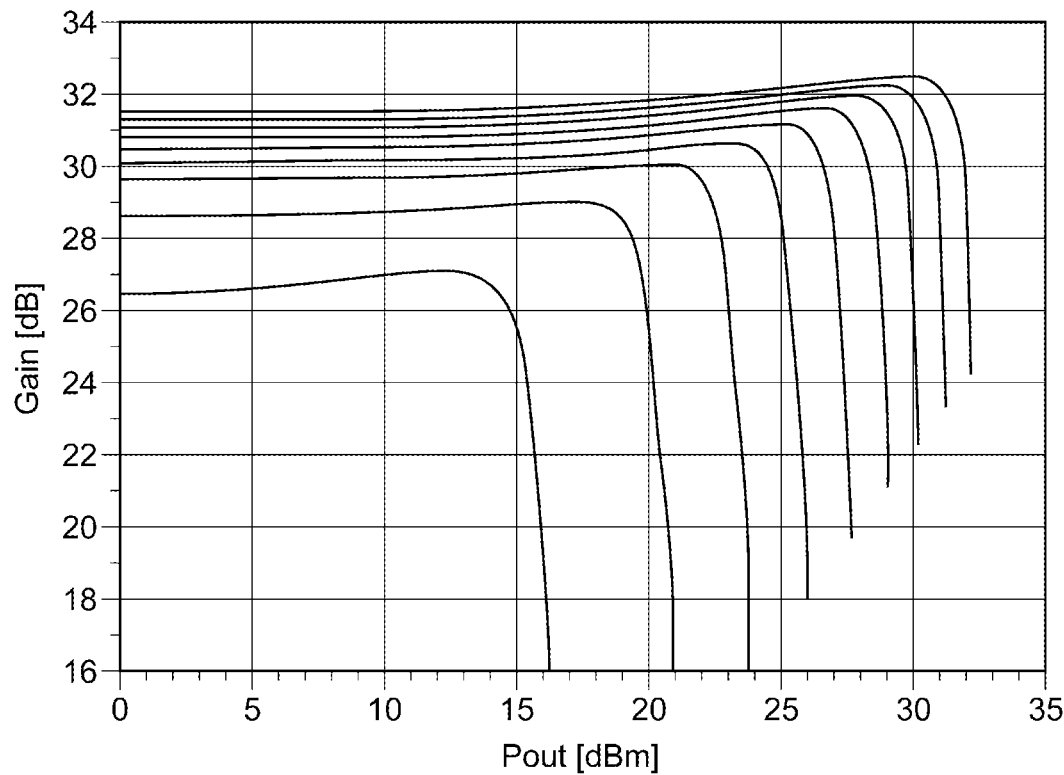
FIG. 12E illustrates graphs representing simulation results of a gain characteristic in the case where, in the power amplifier circuit, the resistance value of the variable resistor is varied.
Figure 12F:
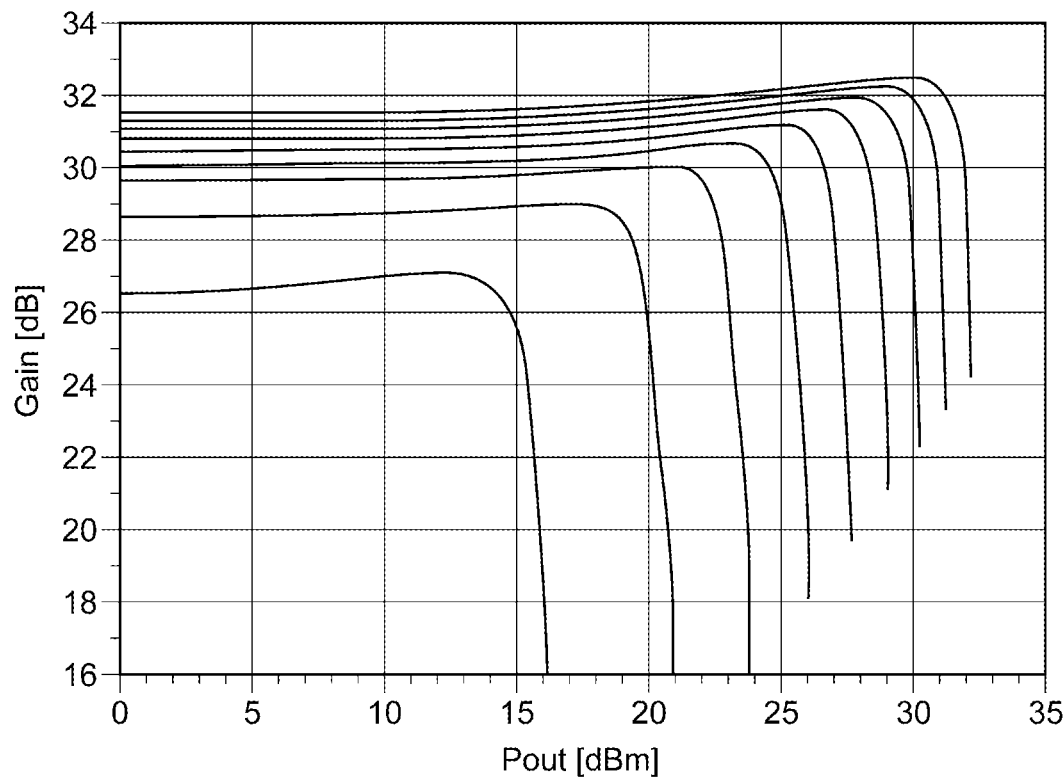
FIG. 12F illustrates graphs representing simulation results of a gain characteristic in the case where, in the power amplifier circuit, the resistance value of the variable resistor is varied.

Next, operation of the power amplifier circuit 100 will be described with reference to FIGS. 4 to 9. In FIG. 4, a reference numeral 200 denotes a graph representing a relationship between the collector-emitter voltage Vce of the transistor Q70 and the variable power-supply voltage Vcc2. In FIG. 4, the horizontal axis represents the variable power-supply voltage Vcc2, and the vertical axis represents the voltage Vce. In FIG. 5, a reference numeral 301 denotes a graph representing a relationship between the current Ief_pwr and the variable power-supply voltage Vcc2. A reference numeral 302 denotes a graph representing a relationship between the bias current Ief_pwr in a power amplifier circuit according to a comparative example and the variable power-supply voltage Vcc2. A configuration of the power amplifier circuit according to the comparative example is a configuration in which, among components included in the power amplifier circuit 100, the adjustment circuit 70 is not included. In FIG. 5, the horizontal axis represents the variable power-supply voltage Vcc2, and the vertical axis represents the current Ief_pwr. In FIG. 6, a reference numeral 401 denotes a graph representing a relationship between the current Icc2 and the variable power-supply voltage Vcc2. A reference numeral 402 denotes a graph representing a relationship between the current Icc2 in the power amplifier circuit according to the comparative example and the variable power-supply voltage Vcc2. In FIG. 6, the horizontal axis represents the variable power-supply voltage Vcc2, and the vertical axis represents the current Icc2. In FIG. 7, a reference numeral 500 denotes a graph representing a relationship between the current Isub_c and the variable power-supply voltage Vcc2. In FIG. 7, the horizontal axis represents the variable power-supply voltage Vcc2, and the vertical axis represents the current Isub_c. In FIG. 8, a reference numeral 600 denotes a graph representing a relationship between the current Isub_b and the variable power-supply voltage Vcc2. In FIG. 8, the horizontal axis represents the variable power-supply voltage Vcc2, and the vertical axis represents the current Isub_b. In FIG. 9, a reference numeral 700 denotes a graph representing a relationship between the current Isub and the variable power-supply voltage Vcc2. In FIG. 9, the horizontal axis represents the variable power-supply voltage Vcc2, and the vertical axis represents the current Isub. The graphs illustrated in FIGS. 4 to 9 represent the results of the simulation obtained when the variable power-supply voltage Vcc2 ranges from greater than or equal to about 0 V to lower than or equal to about 4.5 V. The range of the variable power-supply voltage Vcc2 to be supplied to the collector of the transistor Q2 is not necessarily limited to the range for this simulation. For example, a lower voltage limit (first voltage) of the variable power-supply voltage Vcc2 may be about 1.0 V, and an upper voltage limit (second voltage) of the variable power-supply voltage Vcc2 may be about 4.5 V. Furthermore, although the variable power-supply voltage Vcc2 is used in the following description, the variable power-supply voltage Vcc2 and the variable power-supply voltage Vcc1 are the same in the present embodiment, and a description of the variable power-supply voltage Vcc2 similarly holds true for the variable power-supply voltage Vcc1.

Since the transistor Q70 is a heterojunction bipolar transistor, a turn-on voltage (about 1.1 V) of a base-collector PN junction is different from a turn-on voltage (about 1.3 V) of a base-emitter PN junction. Thus, the transistor Q70 acts differently in accordance with a value of the variable power-supply voltage Vcc2 with respect to a predetermined voltage (third voltage, for example, about 1.5 V) higher than the first voltage and lower than the second voltage. Specifically, when the variable power-supply voltage Vcc2 is in a range higher than the third voltage and lower than the second voltage, the transistor Q70 operates as an emitter follower circuit. On the other hand, when the variable power-supply voltage Vcc2 is in a range greater than or equal to the first voltage and lower than or equal to the third voltage, the transistor Q70 operates as two PN junction diodes.

For convenience of explanation, a path through which a current flows from the bias current source 60 to the base of the transistor Q2 through the resistance element R2 is also referred to as "first current path". The emitter of the transistor Q70 is connected to a first current path L1 through the variable resistor R73. Furthermore, a path through which a current flows from the bias current source 60, through the variable resistor R72, the base and collector of the transistor Q70, and the variable resistor R71, to the power-supply terminal 90 is also referred to as "second current path". The base of the transistor Q60 is connected to a second current path L2 through the variable resistor R72. The emitter of the transistor Q60 is connected to the base of the transistor Q2 through the first current path L1. Furthermore, a path through which a current flows from the power-supply terminal 90, through the variable resistor R71, the collector and emitter of the transistor Q70, the variable resistor R73, and the resistance element R2, to the base of the transistor Q2 is referred to as "third current path".

When the transistor Q70 operates as an emitter follower circuit, the current Ief_pwr flows from the bias current source 60 to the base of the transistor Q2 through the first current path L1, and the current Isub also flows from the power-supply terminal 90 to the base of the transistor Q2 through the third current path. At this time, the current Isub_b is negligibly small (see FIG. 8), and thus the current Isub is approximately equal to the current Isub_c.

On the other hand, when the transistor Q70 operates as two PN junction diodes, a current flows from the bias current source 60 to the power-supply terminal 90 through the second current path L2. This is because, in the transistor Q70, the turn-on voltage of the base-collector PN junction is lower than the turn-on voltage of the base-emitter PN junction, and the current thus flows predominantly between the base and collector of the transistor Q70. At this time, a direction in which the current Isub_c flows is a direction opposite to the direction illustrated in FIG. 3. The adjustment circuit 70 increases the current Isub_c that flows from the bias current source 60 to the power-supply terminal 90 through the second current path L2 as the variable power-supply voltage Vcc2 decreases (see FIG. 7). As the current Isub_c that flows from the bias current source 60 to the power-supply terminal 90 through the second current path L2 increases, the bias current Ief_pwr that flows from the bias current source 60 to the base of the transistor Q2 through the first current path L1 decreases (see FIG. 5).

As illustrated in FIG. 5, the action of the adjustment circuit 70 causes the bias current Ief_pwr in the power amplifier circuit 100 to decrease when the variable power-supply voltage Vcc2 is around the first voltage. Furthermore, when the variable power-supply voltage Vcc2 is around the second voltage, the bias current Ief_pwr in the power amplifier circuit 100 approaches a value of the bias current Ief_pwr in the power amplifier circuit according to the comparative example. Due to a decrease in the bias current Ief_pwr, the current Icc2 that flows to the collector of the transistor Q2 also decreases (see FIG. 6). Thus, the gain of the transistor Q2 when the variable power-supply voltage Vcc2 is in the range greater than or equal to the first voltage and lower than or equal to the third voltage can be reduced.

As described above, in the power amplifier circuit 100 according to the present embodiment, when the transistor Q70 operates as two PN junction diodes as the variable power-supply voltage Vcc2 is in the range greater than or equal to the first voltage and lower than or equal to the third voltage, the bias current Ief_pwr that flows to the base of the transistor Q2 can be reduced. Thus, the gain of the transistor Q2 can be reduced. In particular, in the heterojunction bipolar transistor used as the transistor Q70, the turn-on voltage of the base-collector PN junction is different from the turn-on voltage of the base-emitter PN junction. The use of such characteristics allows, when the transistor Q70 operates as two PN junction diodes, the current Isub_c to flow from the bias current source 60 to the power-supply terminal 90 through the second current path L2. As the current Isub_c that flows from the bias current source 60 to the power-supply terminal 90 through the second current path L2 increases, the bias current Ief_pwr that flows from the bias current source 60 to the base of the transistor Q2 through the first current path L1 can be reduced.

Furthermore, in the present embodiment, when the resistance values of the variable resistors R71 to R73 are set to appropriate values, the amount of decrease in the bias current Ief_pwr can be adjusted. Specifically, for example, in the case of the high-efficiency mode, a resistance value of at least any one of the variable resistors R71 to R73 is reduced, and the range of gain dispersion may thereby be widened. This allows a gain curve to come close to being as flat as possible (see FIG. 2A). On the other hand, in the case of high-linearity mode, a resistance value of at least any one of the variable resistors R71 to R73 is increased, and the range of gain dispersion may thereby be narrowed. This allows the gain of the transistor Q2 obtained when the variable power-supply voltage Vcc2 is the lower voltage limit to coincide with the gain obtained when efficiency is maximized at a maximum output of the transistor Q2 (see FIG. 2B). Thus, in the present embodiment, three variable resistors R71 to R73 whose resistance values are adjustable are provided, and thus the range of gain dispersion of the power amplifier circuit 100 can be variously adjusted.

Furthermore, in the present embodiment, the variable power-supply voltage Vcc1 to be supplied to the first-stage transistor Q1 is supplied to the transistor Q70 of the adjustment circuit 70. This can reduce the influence of the noise included in an amplified signal in comparison with a configuration in which the variable power-supply voltage Vcc2 to be supplied to the subsequent-stage transistor Q2 is supplied to the transistor Q70. Note that, as described later, the configuration is not intended to be removed in which the variable power-supply voltage Vcc2 is supplied to the transistor Q70.

FIGS. 10A to 10F illustrate graphs representing simulation results of a gain characteristic in the case where, in the power amplifier circuit 100, a resistance value of the variable resistor R71 is varied. Specifically, in the graphs in each of FIGS. 10A to 10F, assume that the respective variable power-supply voltages Vcc2 are about 1.0 V, about 1.5 V, about 2.0 V, about 2.5 V, about 3.0 V, about 3.5 V, about 4.0 V, about 4.5 V, and about 5.0 V, and that the resistance values of the variable resistors R72 and R73 are fixed at about 2 kΩ and about 200Ω. In FIGS. 10A to 10F, simulation results obtained in the case where the resistance values of the respective variable resistors R71 are about 0Ω, about 1 kΩ, about 2 kΩ, about 3 kΩ, about 4 kΩ, and about 5 kΩ are illustrated. In FIGS. 10A to 10F, the horizontal axis represents output power Pout (dBm), and the vertical axis represents gain (dB).

From a comparison of FIGS. 10A to 10F, it can be seen that the range of gain dispersion is adjusted in accordance with the resistance value of the variable resistor R71. Specifically, the range of gain dispersion is narrowed as the resistance value of the variable resistor R71 increases.

FIGS. 11A to 11F illustrate graphs representing simulation results of a gain characteristic in the case where, in the power amplifier circuit 100, a resistance value of the variable resistor R72 is varied. Specifically, in the graphs in each of FIGS. 11A to 11F, assume that the respective variable power-supply voltages Vcc2 are about 1.0 V, about 1.5 V, about 2.0 V, about 2.5 V, about 3.0 V, about 3.5 V, about 4.0 V, about 4.5 V, and about 5.0 V, and that the resistance values of the variable resistors R71 and R73 are fixed at about 3 kΩ and about 200Ω. In FIGS. 11A to 11F, simulation results obtained in the case where the resistance values of the respective variable resistors R72 are about 0Ω, about 1 kΩ, about 2 kΩ, about 3 kΩ, about 4 kΩ, and about 5 kΩ are illustrated. In FIGS. 11A to 11F, the horizontal axis represents output power Pout (dBm), and the vertical axis represents gain (dB).

From a comparison of FIGS. 11A to 11F, it can be seen that the range of gain dispersion is also adjusted in accordance with the resistance value of the variable resistor R72 as in the variable resistor R71. Specifically, the range of gain dispersion is narrowed as the resistance value of the variable resistor R72 increases.

FIGS. 12A to 12F illustrate graphs representing simulation results of a gain characteristic in the case where, in the power amplifier circuit 100, a resistance value of the variable resistor R73 is varied. Specifically, in the graphs in each of FIGS. 12A to 12F, assume that the respective variable power-supply voltages Vcc2 are about 1.0 V, about 1.5 V, about 2.0 V, about 2.5 V, about 3.0 V, about 3.5 V, about 4.0 V, about 4.5 V, and about 5.0 V, and that the resistance values of the variable resistors R71 and R72 are fixed at about 3 kΩ and about 2 kΩ. In FIGS. 12A to 12F, simulation results obtained in the case where the resistance values of the respective variable resistors R73 are about 0Ω, about 0.1 kΩ, about 0.2 kΩ, about 0.3 kΩ, about 0.4 kΩ, and about 0.5 kΩ are illustrated. In FIGS. 12A to 12F, the horizontal axis represents output power Pout (dBm), and the vertical axis represents gain (dB).

From a comparison of FIGS. 12A to 12F, it can be seen that the range of gain dispersion is also adjusted in accordance with the resistance value of the variable resistor R73 as in the variable resistors R71 and R72. Specifically, the range of gain dispersion is narrowed as the resistance value of the variable resistor R73 increases. Incidentally, with respect to the variable resistor R73, the range of variation in the range of gain dispersion for a variation in the resistance value is small in comparison with the other two variable resistors R71 and R72, and the sensitivity of the variable resistor R73 is low.

Although, in the above-described embodiment, the example is given where all three resistors connected to the emitter, base, and collector of the transistor Q70 are variable resistors, all of the three resistors do not have to be variable resistors, and it is only necessary that at least any one of the three resistors be a variable resistor.

Furthermore, in the above-described embodiment, the example is given where a bias current to be supplied from the bias current source 60 to the transistor Q2 is adjusted by the adjustment circuit 70. In place of this or in addition to this, a bias current to be supplied from the bias current source 50 to the transistor Q1 may be adjusted by the adjustment circuit 70.

Figure 13:
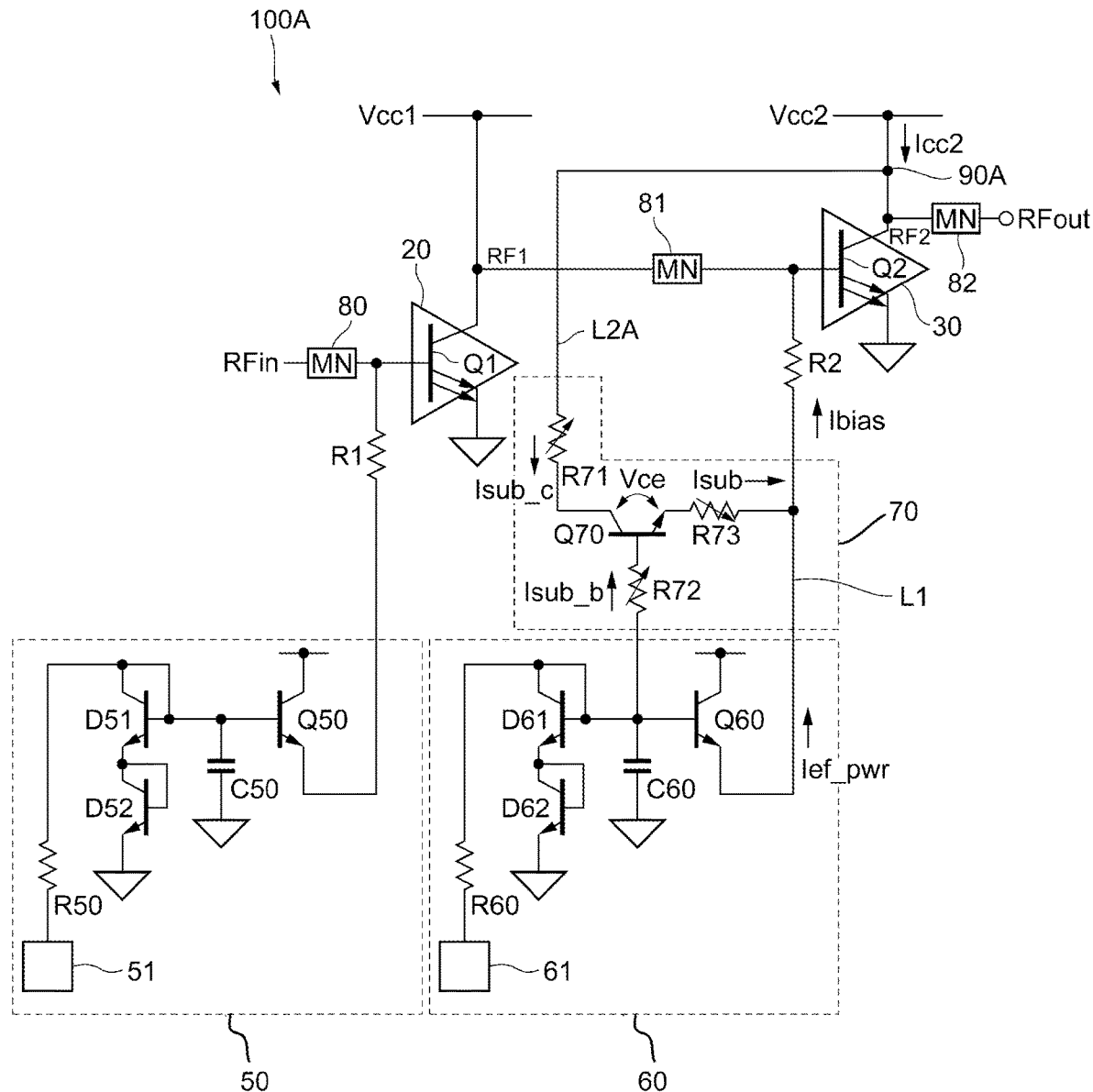
FIG. 13 illustrates an example of a configuration of a power amplifier circuit according to a modification of the embodiment of the present disclosure.

FIG. 13 illustrates an example of a configuration of a power amplifier circuit according to a modification of the embodiment of the present disclosure. In the present modification, a description of things in common with the above-described embodiment is omitted, and only the points in which the modification differs from the embodiment will be described. In particular, similar function effects achieved by similar configurations are not repeatedly described.

As illustrated in FIG. 13, a power amplifier circuit 100A according to the present modification differs from the power amplifier circuit 100 illustrated in FIG. 3 in the source from which voltage is supplied to the transistor Q70 of the adjustment circuit 70. Specifically, in the power amplifier circuit 100A, the variable power-supply voltage Vcc2 to be supplied to the subsequent-stage transistor Q2 is supplied from a power-supply terminal 90A to the collector of the transistor Q70 through the variable resistor R71. That is, a second current path L2A in the present modification is a path connected from the bias current source 60, through the variable resistor R72, the base and collector of the transistor Q70, and the variable resistor R71, to the power-supply terminal 90A.

The power amplifier circuit 100A having such a configuration can also achieve effects similar to those of the above-described power amplifier circuit 100. In the power amplifier circuit 100A, for example, even if a power-supply voltage to be supplied to the first-stage transistor Q1 is a fixed voltage and a power-supply voltage to be supplied to the subsequent-stage transistor Q2 is a variable power-supply voltage, similar effects can be achieved. A fixed voltage to be supplied to the transistor Q1 is a voltage that does not vary in accordance with an envelope of an RF signal, and may be a voltage according to the APT scheme, for example.

Next, an example of a specific configuration of the adjustment circuit 70 will be described.

Figure 14:
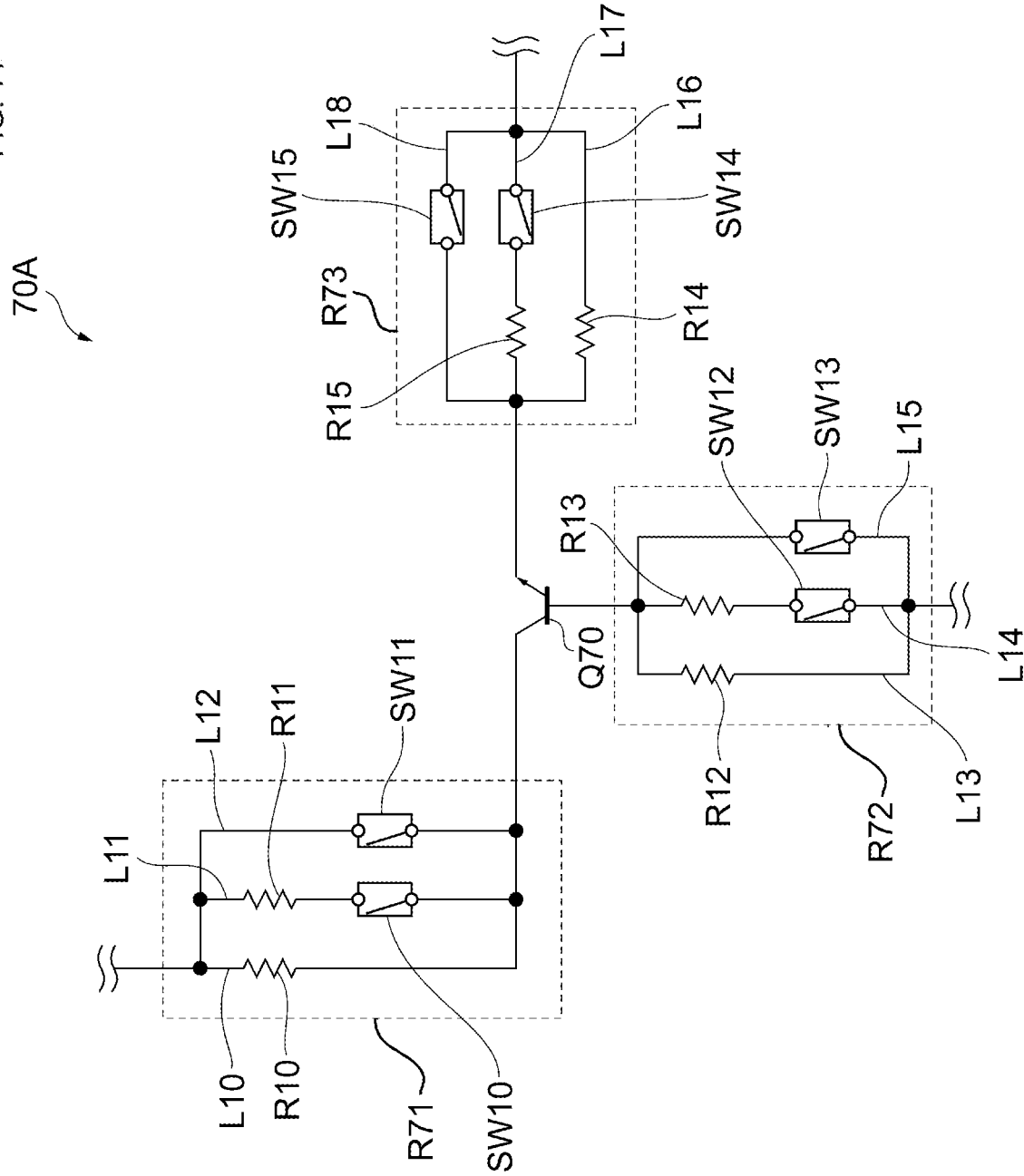
FIG. 14 illustrates a circuit configuration of a specific example of the adjustment circuit.

FIG. 14 illustrates a circuit configuration of a specific example (adjustment circuit 70A) of the adjustment circuit 70. In the adjustment circuit 70A, a resistance value of each of the variable resistors R71 to R73 is adjusted by a combination of a resistance element and a switch.

Specifically, the variable resistors R71 to R73 respectively include a plurality of (three in the present embodiment) branch paths L10 to L12 connected in parallel, a plurality of (three in the present embodiment) branch paths L13 to L15 connected in parallel, and a plurality of (three in the present embodiment) branch paths L16 to L18 connected in parallel. These three branch paths L10 to L12, these three branch paths L13 to L15, and these three branch paths L16 to L18 are configured to have resistance values different from one another.

In the variable resistor R71, a resistance element R10 is provided on the branch path L10, a resistance element R11 and a switch SW10 connected in series with each other are provided on the branch path L11, and a switch SW11 is provided on the branch path L12. Similarly, in the variable resistor R72, a resistance element R12 is provided on the branch path L13, a resistance element R13 and a switch SW12 connected in series with each other are provided on the branch path L14, and a switch SW13 is provided on the branch path L15. Similarly, in the variable resistor R73, a resistance element R14 is provided on the branch path L16, a resistance element R15 and a switch SW14 connected in series with each other are provided on the branch path L17, and a switch SW15 is provided on the branch path L18.

As an example, the variable resistor R71 will be described. Each of the switches SW10 and SW11 is switched between on and off states by a control signal supplied from outside the adjustment circuit 70A. Thus, each of the branch paths L11 and L12 is switched between continuous and discontinuous states, and a combination of branch paths electrically connected to each other is therefore changed. As a result, a combined resistance value of the variable resistor R71 is adjusted. Incidentally, each of the switches SW10 and SW11 may be constituted, for example, by a field-effect transistor (FET) that is formed on an integrated circuit (IC) chip together with the transistors Q1 and Q2 illustrated in FIG. 3. The variable resistors R72 and R73 can have a configuration similar to that of the variable resistor R71, and a detailed description thereof is thus omitted.

As described above, in the adjustment circuit 70A, for example, when each of the switches SW10 to SW15 is switched between on and off states in accordance with an operation mode (high-efficiency mode or high-linearity mode) of the power amplifier circuit 100, the resistance values of the variable resistors R71 to R73 can be adjusted. Incidentally, the number of branch paths included in each variable resistor is not limited to three and may be two or may be four or more. The same holds true for adjustment circuits 70B to 70D to be described.

A method of adjusting the resistance values of the variable resistors R71 to R73 is not limited to such a method of switching a switch on or off. For example, a method may be employed of switching each branch path between continuous and discontinuous states by the presence or absence of a connection member. Examples of configurations (adjustment circuits 70B to 70D) in which the method is used will be described.

Figure 15:
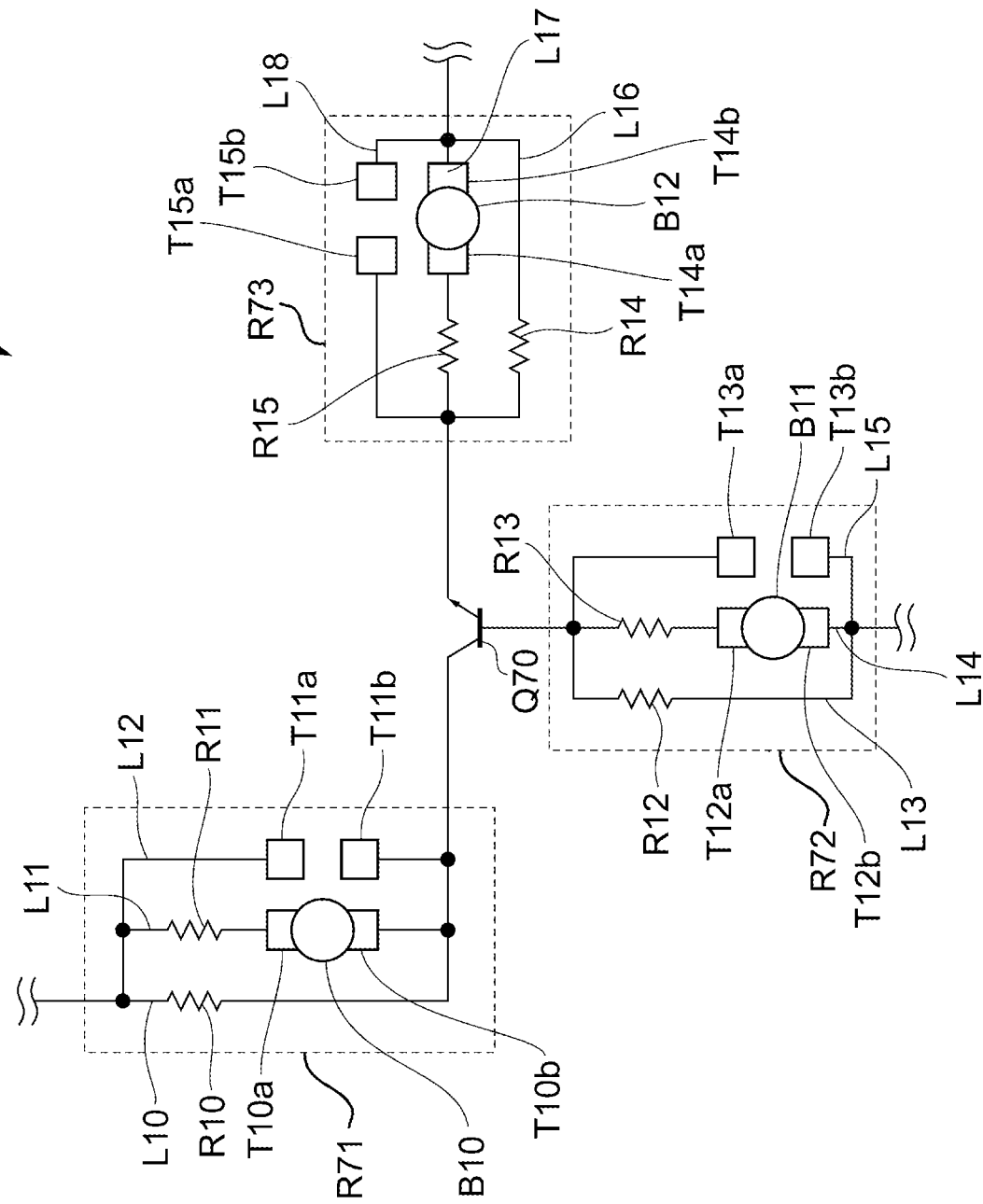
FIG. 15 illustrates a circuit configuration of another specific example of the adjustment circuit.

FIG. 15 illustrates a circuit configuration of another specific example (adjustment circuit 70B) of the adjustment circuit 70. Specifically, in comparison with the variable resistors R71 to R73 of the adjustment circuit 70A, the variable resistors R71 to R73 of the adjustment circuit 70B include a pair of terminals T10a and T10b, a pair of terminals T11a and T11b, a pair of terminals T12a and T12b, a pair of terminals T13a and T13b, a pair of terminals T14a and T14b, and a pair of terminals T15a and T15b, in place of the switches SW10 to SW15.

In the present embodiment, as an example, the variable resistor R71 will be described. At least one pair of the pair of terminals T10a and T10b and the pair of terminals T11a and T11b is selected in accordance with an operation mode of the power amplifier circuit 100, and a ball B10 is formed between the selected pair of terminals by bonding. Similarly, in the variable resistors R72 and R73, at least one pair of the pair of terminals T12a and T12b and the pair of terminals T13a and T13b is selected, at least one pair of the pair of terminals T14a and T14b and the pair of terminals T15a and T15b is selected, and balls B11 and B12 are formed between the selected pads. That is, each of the balls B10 to B12 is a specific example of a connection member that electrically connects a pair of terminals.

Figure 16A:
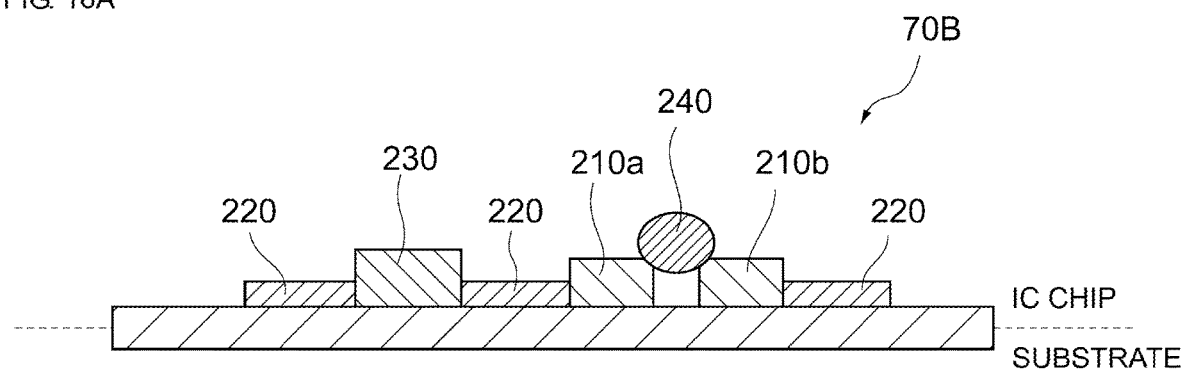
FIG. 16A is a cross-sectional view illustrating a structure of the other specific example of the adjustment circuit.
Figure 16B:
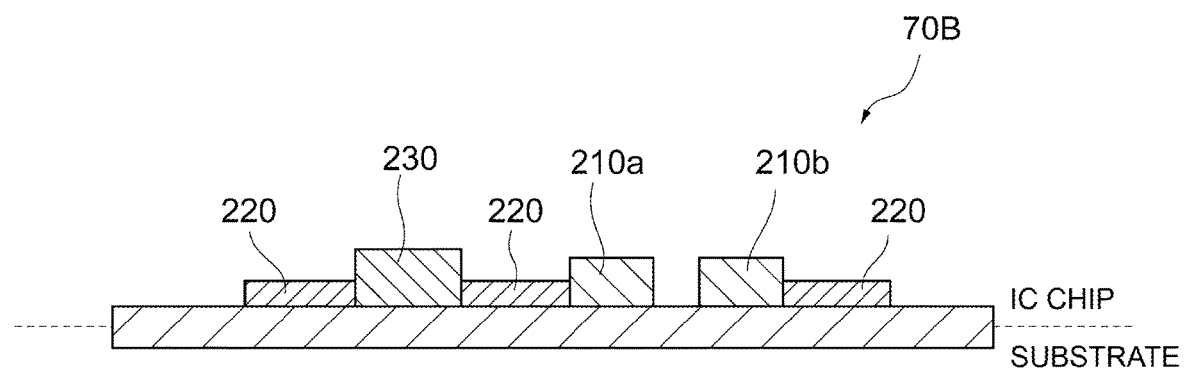
FIG. 16B is a cross-sectional view illustrating a structure of the other specific example of the adjustment circuit.

FIGS. 16A and 16B are cross-sectional views illustrating a structure of the adjustment circuit 70B. The cross-sectional views illustrate a configuration in the case where an IC chip on which the adjustment circuit 70B is formed is packaged on a module substrate by so-called wire bonding packaging.

In the adjustment circuit 70B, each branch path includes a pair of pads 210a and 210b (corresponding, for example, to the pair of terminals T10a and T10b) formed on a semiconductor substrate, a line 220 connected to the pair of pads 210a and 210b, and a resistance element 230 (corresponding, for example, to the resistance element R11) connected to one pad 210a. The pads 210a and 210b are disposed away from each other so that they can be electrically connected to each other by ball bonding. In the case where an electrical connection between the pad 210a and the pad 210b is made, a ball 240 (corresponding, for example, to the ball B10) is formed between the pads 210a and 210B by ball bonding (see FIG. 16A). Thus, the pad 210a and the pad 210b are electrically connected to each other, and a branch path including a resistance value of the resistance element 230 is formed. On the other hand, in the case where a disconnection between the pad 210a and the pad 210b is made, no ball is formed (see FIG. 16B). Thus, a branch path not including the resistance value of the resistance element 230 is formed.

Thus, when a branch path is switched between continuous and discontinuous states by ball bonding, a combined resistance value of each of the variable resistors R71 to R73 may be adjusted.

Figure 17:
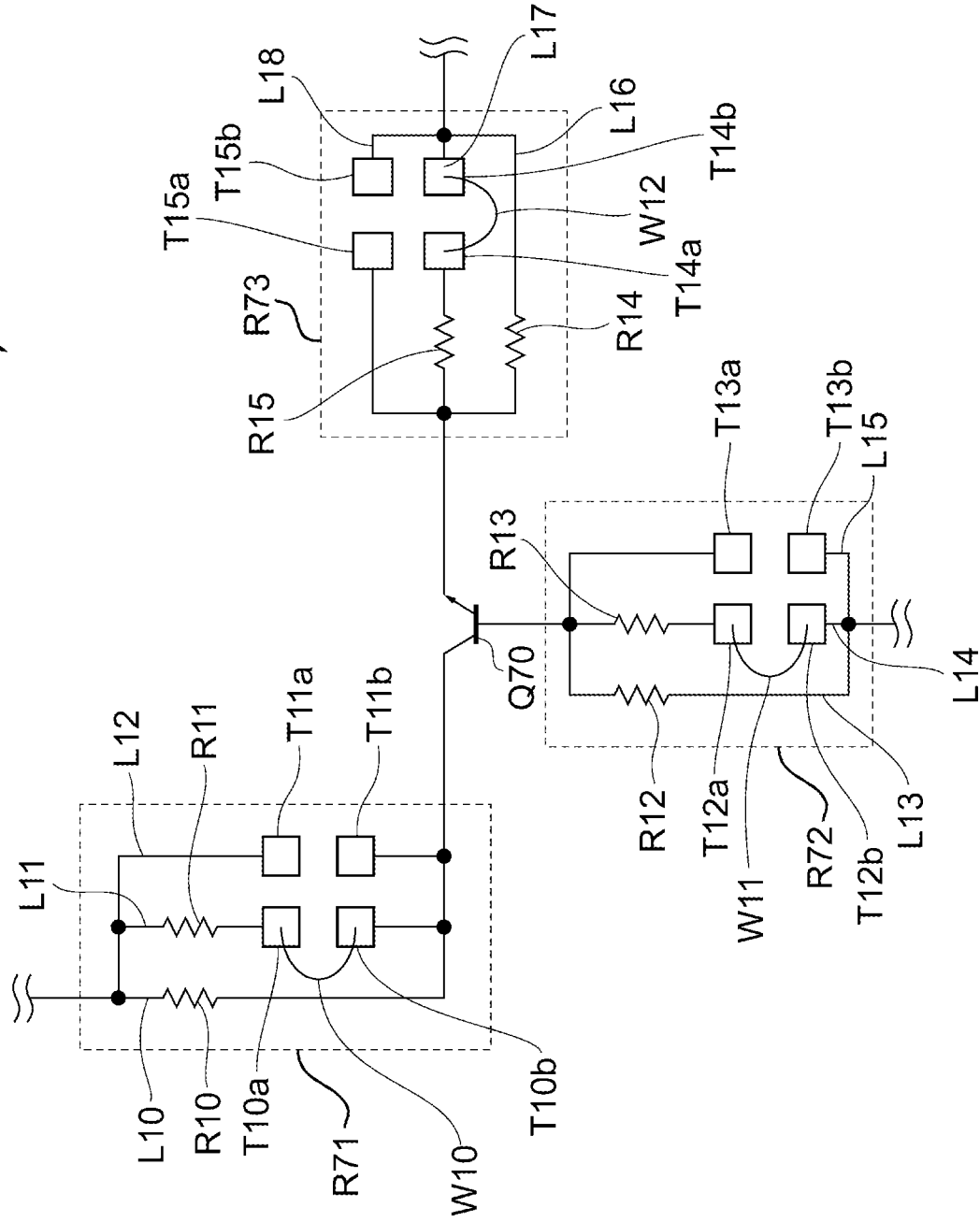
FIG. 17 illustrates a circuit configuration of another specific example of the adjustment circuit.

FIG. 17 illustrates a circuit configuration of another specific example (adjustment circuit 70C) of the adjustment circuit 70. The adjustment circuit 70C differs from the adjustment circuit 70B in that continuity between pads is achieved by wires W10 to W12 in place of the balls B10 to B12. That is, in the adjustment circuit 70C, a pair of pads are disposed away from each other so that they can be electrically connected to each other by wire bonding. Each of the wires W10 to W12 is a specific example of a connection member that electrically connects a pair of pads.

Thus, when a branch path is switched between continuous and discontinuous states by wire bonding, a combined resistance value of each of the variable resistors R71 to R73 may be adjusted.

Figure 18A:
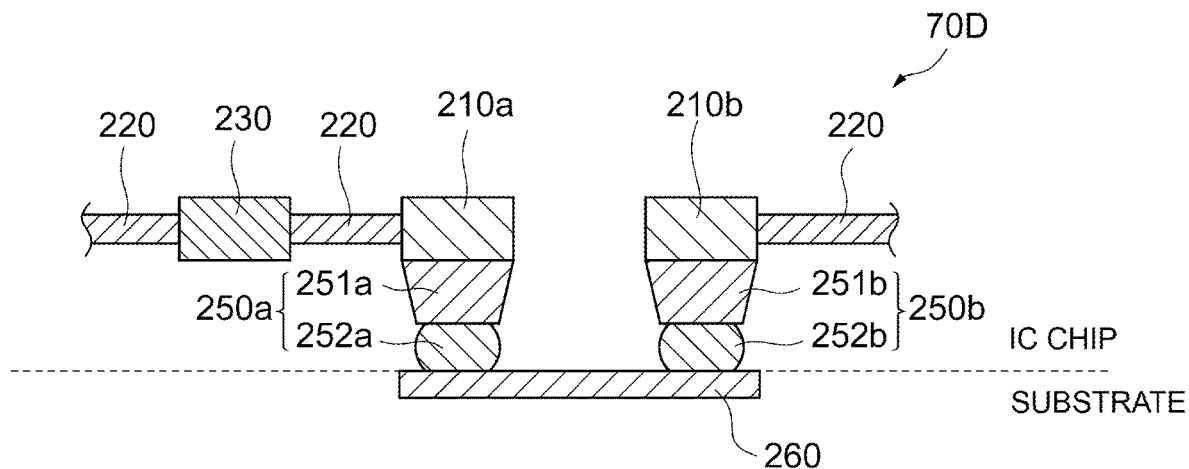
FIG. 18A is a cross-sectional view illustrating a structure of another specific example of the adjustment circuit.
Figure 18B:
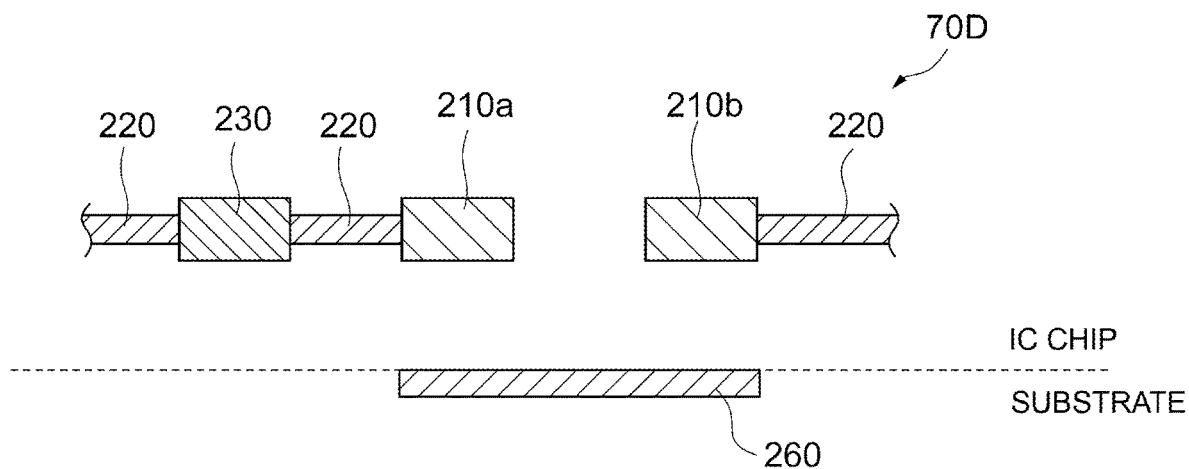
FIG. 18B is a cross-sectional view illustrating a structure of the other specific example of the adjustment circuit.

FIGS. 18A and 18B are cross-sectional views illustrating a structure of another specific example (adjustment circuit 70D) of the adjustment circuit 70. The cross-sectional views illustrate a configuration in the case where an IC chip on which the adjustment circuit 70D is formed is packaged on the module substrate by so-called flip-chip packaging.

Specifically, in the adjustment circuit 70D, the pair of pads 210a and 210b are packaged in an orientation facing a major surface of the module substrate in comparison with the adjustment circuits 70B and 70C. In the case where continuity between the pad 210a and the pad 210b is provided, bumps 250a and 250b are formed that connect the respective pads 210a and 210b to the module substrate. On the module substrate, a line 260 is formed that electrically connects the bump 250a and the bump 250b. Thus, the pad 210a is electrically connected to the pad 210b through the bump 250a, the line 260 that is provided on the module substrate, and the bump 250b (see FIG. 18A). Hence, a branch path including a resistance value of the resistance element 230 is formed. On the other hand, in the case where a disconnection between the pad 210a and the pad 210b is made, no bump is formed for each of the pads 210a and 210b (see FIG. 18B). Thus, a branch path not including the resistance value of the resistance element 230 is formed. That is, each of the bumps 250a and 250b and the line 260 is a specific example of a connection member that electrically connects a pair of pads. A configuration of each of the bumps 250a and 250b is not limited to a particular configuration. For example, copper (Cu) pillar bumps may be employed in which Cu layers 251a and 251b, and solder layers 252a and 252b are formed in sequence on the pads 210a and 210b, respectively.

Thus, when a branch path is switched between continuous and discontinuous states by a bump and a line that is provided on the substrate, a combined resistance value of each of the variable resistors R71 to R73 may be adjusted. In the adjustment circuit 70D, a distance between the pad 210a and the pad 210b can be increased in comparison with the adjustment circuits 70B and 70C, and thus flexibility in pad disposition is increased.

The above-described adjustment circuits 70A to 70D are specific examples for implementing the variable resistors R71 to R73, and the configurations thereof are not limited to these as long as a resistance value is adjustable.

The exemplary embodiment of the present disclosure has been described above. Each of the power amplifier circuits 100 and 100A includes the transistor Q2 including a first terminal to which a voltage corresponding to a variable power-supply voltage Vcc1 or Vcc2 greater than or equal to a first voltage and lower than or equal to a second voltage is supplied and a second terminal to which an RF signal is supplied and being configured to amplify the RF signal; a bias current source configured to supply a bias current to the second terminal of the transistor Q2 through a first current path; and the adjustment circuit 70 configured to adjust the bias current in accordance with the variable power-supply voltage Vcc1 or Vcc2 supplied from the power-supply terminal 90 or 90A. The adjustment circuit 70 includes a first resistor, a second resistor, and a third resistor, at least any one of which is constituted by a variable resistor, and a transistor Q70 including a first terminal connected to the power-supply terminal 90 through the first resistor, a second terminal connected to the bias current source through the second resistor, and a third terminal connected to the first current path through the third resistor. In a case where a voltage higher than the first voltage and lower than the second voltage is regarded as a third voltage and a path extending from the bias current source, through the second resistor, the transistor Q70, and the first resistor, to the power-supply terminal 90 is regarded as a second current path, when the variable power-supply voltage Vcc1 or Vcc2 is greater than or equal to the first voltage and lower than or equal to the third voltage, the adjustment circuit 70 increases a current that flows to the power-supply terminal 90 through the second current path as the variable power-supply voltage Vcc1 or Vcc2 decreases. When the resistance values of the variable resistors R71 to R73 are set to appropriate values, the amount of decrease in the bias current can be adjusted. Hence, the range of gain dispersion of the power amplifier circuit 100 can be variously adjusted.

Furthermore, the power amplifier circuit 100 includes the transistor Q1 including a first terminal to which the variable power-supply voltage Vcc1 is supplied and a second terminal to which an input signal is supplied and being configured to amplify the input signal and output the RF signal. In the power amplifier circuit including multiple stages of transistors Q1 and Q2, when the variable power-supply voltage Vcc1 to be supplied to the first-stage transistor Q1 is supplied to the transistor Q70 of the adjustment circuit 70, the influence of the noise included in an amplified signal can be reduced in comparison with a configuration in which the variable power-supply voltage Vcc2 to be supplied to the subsequent-stage transistor Q2 is supplied.

Furthermore, in the adjustment circuit 70A, each of the variable resistors R71 to R73 includes a plurality of branch paths connected in parallel, the plurality of branch paths have resistance values different from one another, and, on at least one branch path of the plurality of branch paths, a switch configured to switch the at least one branch path between continuous and discontinuous states is provided. Thus, a combined resistance value of each of the variable resistors R71 to R73 can be adjusted.

Furthermore, in each of the adjustment circuits 70B to 70D, each of the variable resistors R71 to R73 includes a plurality of branch paths connected in parallel, the plurality of branch paths have resistance values different from one another, a pair of pads is provided on at least one branch path of the plurality of branch paths, and the at least one branch path is switched between continuous and discontinuous states by presence or absence of a connection member that electrically connects the pair of pads. Thus, a combined resistance value of each of the variable resistors R71 to R73 can be adjusted.

Furthermore, in the adjustment circuit 70C, the connection member includes the wires W10 to W12 that each connect a pair of pads.

Furthermore, in the adjustment circuit 70D, the power amplifier circuit is formed on a chip that is to be packaged on a substrate, and the connection member includes bumps that connect the pair of pads to the substrate, and a line that connects the bumps and is provided on the substrate. Thus, flexibility in pad disposition is increased in comparison with the adjustment circuits 70B and 70C.

Furthermore, the power amplifier circuit 100A further includes the transistor Q1 including a first terminal to which a fixed power-supply voltage Vcc1 is supplied and a second terminal to which an input signal is supplied and being configured to amplify the input signal and output the RF signal. Thus, even if the power-supply voltage Vcc1 to be supplied to the first-stage transistor Q1 is a fixed voltage, the effects similar to those of the power amplifier circuit 100 can be achieved.

The above-described embodiment is intended to facilitate understanding of the present disclosure, but is not intended for a limited interpretation of the present disclosure. The present disclosure can be changed or improved without departing from the gist thereof and includes equivalents thereof. That is, appropriate design changes made to the embodiment by those skilled in the art are also included in the scope of the present disclosure as long as the changes have features of the present disclosure. The elements included in the embodiment, and the arrangements and so forth of the elements are not limited to those exemplified in the embodiment and can be appropriately changed.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    a first transistor including a first terminal to which a voltage corresponding to a variable power-supply voltage greater than or equal to a first voltage and lower than or equal to a second voltage is supplied from a power-supply terminal and a second terminal to which an RF signal is supplied, the first transistor being configured to amplify the RF signal;
    a bias current source configured to supply a bias current to the second terminal of the first transistor through a first current path; and
    an adjustment circuit configured to adjust the bias current in accordance with the variable power-supply voltage,
    wherein the adjustment circuit includes
    a first resistor, a second resistor, and a third resistor, wherein at least one of the first resistor, the second resistor, or the third resistor is a variable resistor, and
    an adjustment transistor including a first terminal connected to the power-supply terminal through the first resistor, a second terminal connected to the bias current source through the second resistor, and a third terminal connected to the first current path through the third resistor, and
    wherein, when the variable power-supply voltage is greater than or equal to the first voltage and lower than or equal to a third voltage higher than the first voltage and lower than the second voltage, the adjustment circuit increases a current that flows to the power-supply terminal through a second current path extending from the bias current source, through the second resistor, the adjustment transistor, and the first resistor, to the power-supply terminal, as the variable power-supply voltage decreases.

2. The power amplifier circuit according to claim 1, further comprising a second transistor including a first terminal to which the variable power-supply voltage is supplied and a second terminal to which an input signal is supplied, the second transistor being configured to amplify the input signal and output the RF signal.

3. The power amplifier circuit according to claim 1, wherein the variable resistor includes a plurality of branch paths connected in parallel,
wherein the plurality of branch paths have resistance values different from one another, and
wherein, on at least one branch path of the plurality of branch paths, a switch configured to switch the at least one branch path between continuous and discontinuous states is provided.

4. The power amplifier circuit according to claim 2, wherein the variable resistor includes a plurality of branch paths connected in parallel,
wherein the plurality of branch paths have resistance values different from one another, and
wherein, on at least one branch path of the plurality of branch paths, a switch configured to switch the at least one branch path between continuous and discontinuous states is provided.

5. The power amplifier circuit according to claim 1, wherein the variable resistor includes a plurality of branch paths connected in parallel,
wherein the plurality of branch paths have resistance values different from one another,
wherein, on at least one branch path of the plurality of branch paths, a pair of pads is provided, and
wherein the at least one branch path is switched between continuous and discontinuous states by presence or absence of a connection member that electrically connects the pair of pads.

6. The power amplifier circuit according to claim 2, wherein the variable resistor includes a plurality of branch paths connected in parallel,
wherein the plurality of branch paths have resistance values different from one another,
wherein, on at least one branch path of the plurality of branch paths, a pair of pads is provided, and
wherein the at least one branch path is switched between continuous and discontinuous states by presence or absence of a connection member that electrically connects the pair of pads.

7. The power amplifier circuit according to claim 5, wherein the connection member includes a wire that connects the pair of pads.

8. The power amplifier circuit according to claim 5, wherein the power amplifier circuit is provided on a chip packaged on a substrate, and
wherein the connection member includes bumps that connect the pair of pads to the substrate, and a line that connects the bumps, the line being provided on the substrate.

9. The power amplifier circuit according to claim 1, further comprising a second transistor including a first terminal to which a fixed power-supply voltage is supplied and a second terminal to which an input signal is supplied, the second transistor being configured to amplify the input signal and output the RF signal.

10. The power amplifier circuit according to claim 2, wherein the power-supply terminal supplies a first variable power-supply voltage to the first terminal of the first transistor and a second variable power-supply voltage to the first terminal of the second transistor.

11. The power amplifier circuit according to claim 10, wherein the second variable power-supply voltage is the variable power-supply voltage and the first variable power-supply voltage is the voltage corresponding to the variable power-supply voltage.

12. The power amplifier circuit according to claim 11, wherein the adjustment circuit adjusts the bias current in accordance with the first variable power-supply voltage or the second variable power-supply voltage.

13. The power amplifier circuit according to claim 11, wherein the adjustment circuit adjusts the bias current in accordance with the first variable power-supply voltage.

14. The power amplifier circuit according to claim 11, wherein the first variable power-supply voltage is supplied to a terminal of the adjustment transistor.

15. The power amplifier circuit according to claim 11, wherein the second variable power-supply voltage is supplied to a terminal of the adjustment transistor through the first resistor.

16. The power amplifier circuit according to claim 1, wherein the bias current is adjusted according to values of the first resistor and the third resistor.

17. The power amplifier circuit according to claim 1, wherein the bias current source comprises two diodes connected in series, a third transistor, and the power-supply terminal.

18. The power amplifier circuit according to claim 17, wherein the two diodes are implemented by a diode-connected bipolar transistor.

19. The power amplifier circuit according to claim 1, further comprising a matching network connected between the first transistor and the second transistor.

20. The power amplifier circuit according to claim 2, further comprising a matching network connected between a previous stage before the power amplifier circuit and the second terminal of the second transistor.

21. The power amplifier circuit according to claim 1, further comprising a matching network connected between an output of the first transistor and a subsequent stage after the power amplifier circuit.

* * * * *